US005587691A

United States Patent [19]

Yabe et al.

[11] Patent Number: 5,587,691

[45] Date of Patent: Dec. 24, 1996

[54] DIGITAL TRIMMING FOR FREQUENCY ADJUSTMENT

[75] Inventors: Hiroshi Yabe; Tsutomu Ogihara, both of Suwa, Japan

[73] Assignee: Seiko Epson Corporation, Tokyo-tu, Japan

[21] Appl. No.: 478,782

[22] Filed: Jun. 7, 1995

Related U.S. Application Data

[62] Division of Ser. No. 47,279, Apr. 19, 1993.

[30] Foreign Application Priority Data

| | | | |
|---|---|---|---|
| Apr. 17, 1992 | [JP] | Japan | 4-097888 |
| May 14, 1992 | [JP] | Japan | 4-122154 |
| Feb. 22, 1993 | [JP] | Japan | 5-031783 |

[51] Int. Cl.[6] .......... H03B 19/00

[52] U.S. Cl. .......... 331/44; 331/74; 331/177 R; 327/113; 368/201; 377/47

[58] Field of Search .......... 331/74, 177 R, 331/44; 368/201, 200; 377/47; 327/113, 115

[56] References Cited

U.S. PATENT DOCUMENTS

| | | | |
|---|---|---|---|
| 4,009,445 | 2/1977 | Hasegawa | 368/201 |
| 4,043,109 | 8/1977 | Numabe | 368/201 |
| 4,075,827 | 2/1978 | Yoshida et al. | 331/177 R |
| 4,114,363 | 9/1978 | Imamura | 368/201 |
| 4,225,824 | 9/1980 | Sekine et al. | 327/115 |
| 4,336,608 | 6/1982 | Berney | 368/82 |
| 4,382,692 | 5/1983 | Wiget et al. | 368/157 |

FOREIGN PATENT DOCUMENTS

| | | | |
|---|---|---|---|
| 53-108477 | 9/1978 | Japan . | |
| 54-133163 | 10/1979 | Japan | 368/201 |
| 54-155869 | 12/1979 | Japan . | |
| 57-86082 | 5/1982 | Japan . | |
| 59-56189 | 3/1984 | Japan . | |

OTHER PUBLICATIONS

Patent Abstracts of Japan, vol. 4 No. 184 (P-041), Dec. 18, 1980 & JP-A-55-128188 (Yoshida), Oct. 3, 1980.

*Primary Examiner*—Andrew M. Dolinar
*Attorney, Agent, or Firm*—Oliff & Berridge

[57] ABSTRACT

A digital trimming circuit is used to produce a stable time reference signal. This type of reference time signal can be used in equipment, such as watches, which have motors and acoustic outputs that interfere with producing the time reference signal. A basic oscillation frequency, which is produced by an oscillator circuit, is frequency divided to form the generic time reference signal. The digital trimming circuit generates a control signal to shorten the period of the time reference signal by predetermined amounts based on correction data. The control signal is in the form of pulses which can be dispersively applied to create substantially equal intervals between pulses during one time period of the time reference time signal. While maintaining the necessary digital trimming amount in one digital trimming time period, an expansion/reduction amount of the time reference signal is suppressed at one digital trimming time instant. Therefore, interference between the digital trimming timing and the predetermined output timing can be avoided.

6 Claims, 14 Drawing Sheets

DIGITAL TRIMMING FOR FREQUENCY ADJUSTMENT

This is a divisional of application Ser. No. 08/047,279, filed Apr. 19, 1993.

BACKGROUND OF THE INVENTION

1. Field of the Invention

The present invention relates to digital trimming for frequency adjustment for correcting a temporal shift of a time reference signal with regard to absolute time. More particularly, the digital trimming to correct the temporal shift of the time reference signal is performed in an IC (integrated circuit) used in a watch.

2. Description of Related Art

In an IC used in a watch, for instance, digital trimming methods have been used to correct a temporal shift of a time reference signal output from an oscillator circuit with regard to absolute time. One type of digital trimming method uses a frequency-divided signal functioning as the time reference signal. Another type of digital trimming method uses a fundamental signal that is expanded/compressed only by a required correction amount (digital trimming amount) at a predetermined correction period (digital trimming period).

In FIG. 13, a digital trimming circuit employing a conventional digital trimming method is shown. This digital trimming circuit includes an oscillator circuit 10 oscillated at a frequency of 32 KHz as a basic oscillation. A variable frequency dividing circuit 20 is connected to the output of the oscillator circuit 10. The variable frequency dividing circuit 20 uses ½-frequency dividers 22, 24 and 26 which each have data set functions. A frequency dividing circuit 30 generates a time reference signal $S_T$ from the output of the variable frequency dividing circuit 20. A digital trimming period forming circuit 40 generates a digital trimming period signal $S_F$ based on the signal from the frequency dividing circuit 30. The digital trimming circuit further includes a digital trimming execution timing signal forming circuit 50 for generating a digital trimming timing signal VCW based upon the digital trimming period signal $S_F$ and the basic oscillation clock $f_0$ having the frequency of 32 KHz. Correction data supplying means 60 supplies, for example, a 3-bit correction data $(CBA)_2$ to a frequency division rate setting circuit 70. When the digital trimming execution timing signal VCW has been generated, the frequency division rate setting circuit 70 transfers the correction data $(CBA)_2$ to the respective set inputs "S" of the ½-frequency dividers 22, 24, 26. The correction data in position "A" is transferred to the set input of the ½-frequency divider 22. The correction data in position "B" is transferred to the set input of the ½-frequency divider 24. The correction data in position "C" is transferred to the set input of the ½-frequency divider 26.

The digital trimming execution timing signal forming circuit 50 is constructed of a latch 52 and a NOR gate 54. The latch 52 receives the digital trimming period signal $S_F$ as the data input "D" when the clock input CL is under a high level (hereinafter referred to as an "H" level). The latch 52 transfers this data input to the invert output XM, and maintains the invert output XM when the clock input CL is under a low level (hereinafter referred to as an "L" level). The NOR gate 54 receives as an input the digital trimming period signal $S_F$ and the invert output XM.

The frequency dividing ratio setting circuit 70 has three AND gates 72, 74 and 76. Each AND gate receives the VCW signal and one of the bits from the 3-bit correction data $(CBA)_2$.

Normally, the time period "T" of the digital trimming period signal $S_F$ is a relatively long time period defined from several seconds to several hundred seconds. As shown in FIG. 14, the digital trimming period signal $S_F$ is obtained by frequency dividing the output signal (4 KHz) of the ½-frequency divider 26 by the frequency dividing circuit 30. When the signal level of this digital trimming period signal $S_F$ is changed from the "H" level into the "L" level, all of the frequency signals, 32 KHz-signal, 16 KHz-signal, 8 KHz-signal, and 4 KHz-signal, are in the "L" state. Before $S_F$ changes state, the signal level of the digital trimming period signal $S_F$ and the signal level of the original oscillation clock $f_0$ as the clock input CL are in the "H" state, and the signal level of the invert output XM of the latch 52 is in the "L" state. Then the digital trimming period signal $S_F$ changes from the "H" level to the "L" level. After this change of states and during a t/2 time period (½ time period) where the basic oscillation clock $f_0$ is under the "L" level, the signal level of the invert output XM is maintained at the "L" state. As a consequence, the digital trimming execution timing signal VCW with the "H" level is produced over the ½ time period.

When the signal state of the digital trimming timing signal VCW is at the "H" level, and the correction data $(CBA)_2$ is $(011)_2$, for example, the content of the variable frequency circuit 20 is set to the condition of the point "P" during this t/2 time period. If, for example, the correction data $(CBA)_2$ is $(111)_2$, then the content of the variable frequency dividing circuit 20 is set to the condition of the point "Q" during this t/2 time period. As a result, when the variable frequency dividing circuit 20 is set to the point P, the period reference signal $S_T$ is shortened by a digital trimming amount $T_p=(1/32\ \text{KHz})\times 3=92$ microseconds with respect to the digital trimming time period. Also, when the variable frequency dividing circuit 20 is set to the point Q, the period reference signal $S_T$ is shortened by a digital trimming amount $T_Q=(1/32\ \text{KHz})\times 7=214$ microseconds with regard to the digital trimming time period.

In this example and in the preferred embodiments, the correction data is 3-bit data to make the circuits simpler. However, the correction data can be any number of bits and is usually on the order of 5 bits. When a 5-bit correction data is used, the maximum digital trimming amount reaches 0.98 milliseconds.

In general, assume that a number of bits in the correction data is selected to be "K," a digital trimming amount ΔT is given by the following equation:

$$\Delta T=K\times t \tag{1}$$

For example, in the case of an N-bit correction data, the correction data value "K" is 0 through $2^N-1$. Therefore, the digital trimming rate "η" corresponding to the digital trimming amount within a unit time is given by the following formula:

$$\eta=\Delta T/T=k\times t/T \tag{2}$$

Also, the digital trimming solution "μ" corresponding to the minimum digital trimming rate is given by the following equation:

$$\mu=t/T \tag{3}$$

The above-described digital trimming apparatus suffers from the following problems, especially if the apparatus is used in a watch which has motor drive pulse outputs or an acoustic output. With respect to the period reference signal $S_T$, the necessary digital trimming amount ΔT has been performed during every time digital trimming time period T. If the digital trimming amount ΔT becomes large, then the period reference signal $S_T$ is considerably expanded/compressed at a time instant when the digital trimming operation is executed. As a result, if the motor drive pulse output and the acoustic output happened to be superimposed at the digital trimming timing, the waveforms of the respective output pulses would be changed. This waveform change may cause a deterioration in the stability of the operation of the motor drive or an interruption in the acoustic outputs. In order to avoid this problem, the digital trimming timings are shifted from the timings of the motor drive pulse outputs and the acoustic outputs.

This solution may not always solve the problem. There are long periods of "unknown" time if a watch has a chronograph function in which a motor must be rotated at a fast time period for a long time. Long periods of time may be created if a multi-hand/multi-motor watch, which uses a plurality of motors, are controlled in an asynchronous mode. Also, a watch may have a melody output function in which an acoustic output is continued for a long time. In these situations, the digital trimming timing cannot be shifted; however, the digital trimming operations should be interrupted. Therefore, the time reference signal may drift from the original time reference signal during these long interrupt time periods.

SUMMARY OF THE INVENTION

The present invention solves the above-described problems, and therefore, provides a digital trimming apparatus capable of achieving a necessary digital trimming rate while suppressing an expansion/compression amount of a time reference signal at a time instant when a digital trimming operation is carried out. In this invention, an interference occurring between a digital trimming timing and a predetermined output timing are avoided.

In the present invention, a dispersive digital trimming method is employed. A plurality of digital trimming operations with short digital trimming are dispersively executed during one digital trimming time period. In a digital trimming apparatus according to the present invention, a digital trimming amount supplying means executes the digital trimming operation with a predetermined digital trimming amount in response to the initiation control pulse signal. The time reference signal produced is based upon the original oscillation signal derived from the oscillating means. The apparatus also includes a digital trimming amount-to-pulse number converting means for producing the initiation control pulse signal within one digital trimming time period. The number of pulses corresponds to the correction data for designating the digital trimming amount which should be executed within one digital trimming time period.

The digital trimming amount-to-pulse number converting means may have a digital trimming timing interval decision means for producing a timing reference signal. This timing reference signal has a time period shorter than one digital trimming time period based upon the basic oscillation frequency. This converting means may also have a digital trimming timing decision means for outputting the initiation control signal at each time period. The decision means counts the number of pulses in the time period for the timing reference signal until that number reaches the pulse number corresponding to the correction data.

There are other ways to construct the digital trimming amount-to-pulse number converting means. A digital trimming timing equally allocating means will allocate the generation of the initiation control signal so as to create substantially equal time intervals. These time intervals are obtained by dividing one digital trimming time period by the number of pulses necessary to shorten the reference time signal. The digital trimming amount applying means may include a variable frequency dividing means. In the alternative, this digital trimming amount applying means may have complementary signal forming means to generate an in-phase signal and a reverse phase signal based upon the original oscillation signal. A signal selecting means is used to selectively output the in-phase signal and the reverse phase signal in response to the control signal. The digital trimming amount-to-pulse number converting means may include a microcomputer. The digital trimming apparatus may be a semiconductor integrated circuit.

The digital trimming amount-to-pulse number converting means produces the initiation control pulse signal within one digital trimming time period, the number of pulses corresponds to the correction data for designating the digital trimming amount which should be executed within one digital trimming time period. Since the initiation control pulse signals are obtained within one digital trimming time period, a plurality of digital trimming operations are dispersively performed within one digital trimming time period. The digital trimming amount of the digital trimming amount applying means is coincident with such a value calculated by dividing, for instance, the digital trimming amount to be operated within one digital trimming time period by the pulse number. Then, the digital trimming amount required within one digital trimming time period is applied. Therefore, the digital trimming amount can be coincident with the logic digital trimming rate required for the time reference signal.

The expansion/reduction amount for the time reference signal at the digital trimming timing can be suppressed. In other words, since the digital trimming operation with the minimum expansion/reduction amount corresponding to the time period of the basic oscillation signal can be realized, interference caused by the digital trimming timing and a predetermined output timing may be negligible, or greatly suppressed.

The digital trimming timing equal-allocating means generates the initiation control signal. This means allocates pulses at substantially equivalent time intervals. The time intervals are calculated by dividing one digital trimming time period by the above-described pulse number. Therefore, a plurality of digital trimming timings are not concentrated into a portion of one digital trimming time period, but are dispersed. As a result, a reduction in the negative affect of the output timings is achieved.

When the complementary signal forming means generates the in-phase signal and the reverse phase signal in response to the basic oscillation signal, and also the signal selecting means for selecting the in-phase signal and the reverse phase signal to be output are employed as the digital trimming amount applying means, the digital trimming operation with the minimum digital trimming amount equal to a half time period of the original oscillation signal can be performed. The above-described benefits are achieved by the present invention.

BRIEF DESCRIPTION OF THE DRAWINGS

For a better understanding of the present invention, reference is made to the following detailed description in conjunction with the accompanying drawings, in which.

DETAILED-DESCRIPTION OF PREFERRED EMBODIMENTS

Figure 1:
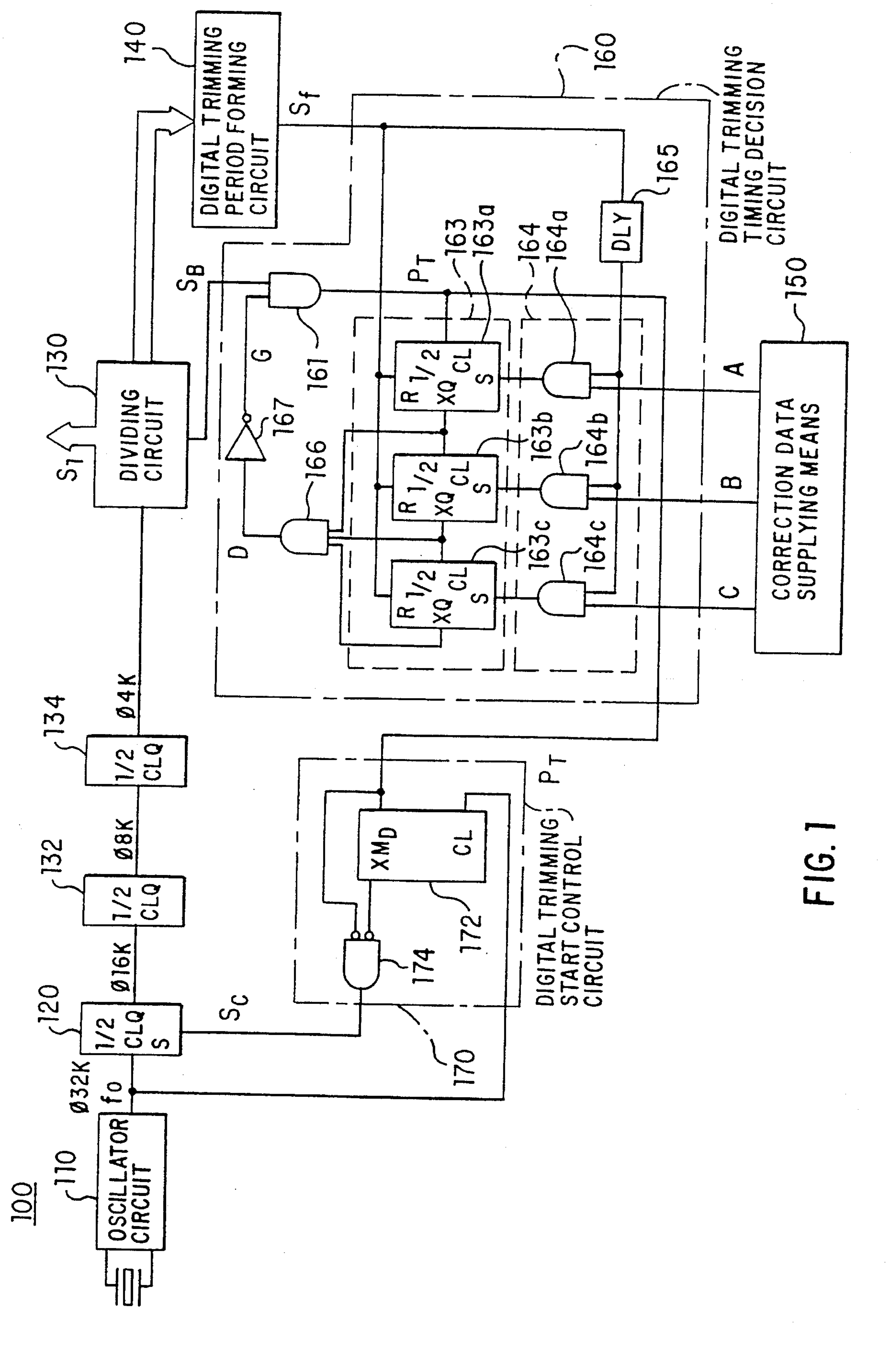
FIG. 1 is a schematic block diagram showing an arrangement of a digital trimming circuit according to a first preferred embodiment of the present invention.

Referring now to the accompanying drawings, preferred embodiments of the present invention will be described. FIG. 1 is a schematic block diagram showing a circuit arrangement of a digital trimming apparatus according to a first preferred embodiment of the present invention. This digital trimming apparatus of FIG. 1 may be performed by a semiconductor integrated circuit. This digital trimming circuit 100 includes an oscillator circuit 110 oscillated at a basic oscillation frequency $f_0$ of 32 KHz. A ½-frequency divider 120, which has a data setting function, divides the basic oscillation frequency $f_0$. The ½-frequency divider 120 functions as a digital trimming amount applying means. Two ½-frequency dividers 132 and 134 generate signals having frequencies of 8 KHz and 4 KHz, respectively. Frequency dividing circuit 130 divides the 4 KHz signal to obtain a time reference signal $S_T$.

The digital trimming circuit 100 further includes a digital trimming period forming circuit 140 for generating a digital trimming period signal $S_F$ based on the signal of the frequency dividing circuit 130. A digital trimming timing decision circuit 160 produces a digital trimming timing signal (pulse) $P_T$. This pulse corresponds to a correction data within a digital trimming time period. The digital trimming timing signal $P_T$ is generated from the following signals: the digital trimming period signal $S_F$; a timing reference signal $S_B$ having a shorter period than the period of the digital trimming period signal $S_F$, and produced from the frequency dividing circuit 130; and correction data $(CBA)_2$ from the correction data supplying means 150. A digital trimming start control circuit 170 produces a digital trimming execution control signal $S_C$ in response to the digital trimming timing signal $P_T$ and the basic clock $f_0$. The digital trimming execution control signal $S_C$ is used to set, or initialize, the ½-frequency divider 120 which has a data set function.

The digital trimming timing decision circuit 160 has an AND gate 161 which operates like an open/close circuit. In response to a gate open/close controlling signal, the AND gate 161 receives a propagation of a timing reference signal $S_B$ from the frequency dividing circuit 130. The output of the AND gate 161 is the digital trimming timing signal $P_T$. A 3-bit down counter 163 is constructed of three ½-frequency dividers **163*a*, 163*b*, 163*c* with set/reset functions. Each ½-frequency divider can be reset by the digital trimming time period signal $S_F$. The 3-bit down counter 163 performs the count down operation of the correction data $(CBA)_2$ in response to the digital trimming timing signal $P_T$. A correction data setting circuit 164 is constructed of AND gates 164*a*, 164*b* and 164*c*. The inputs of the AND gates 164*a*, 164*b* and 164*c* are each connected to receive one bit from the correction data supplying means 150 and the output of a delay circuit 165 which is produced from the digital trimming time period signal $S_F$. The AND gates 164*a*, 164*b* and 164*c* are connected to the set terminals of ½-frequency dividers 163*a*, 163*b* and 163*c*, respectively. The correction data setting circuit 164 transfers the correction data $(CBA)_2$ to the 3-bit down counter 163 when a level of a delay signal from the delay circuit 165 is changed from "H" to "L". An AND gate 166, which functions as a digital trimming cancel detecting circuit, "is connected to the invert outputs of the ½-frequency dividers 163*a*, 163*b* and 163*c*. This AND gate 166 produces a detecting output signal "D", which is in the "H" state when all of the inverted outputs "XQ" from the respective ½-frequency dividers of the down counter 163 are in an "H" state. An inverter 167 is added to invert the detection output signal D to the "L" state in order to obtain a gate opening/closing control signal "G". When the detection output signal D is in the "L" state, then the timing reference signal $S_B$ is sent through the AND gate 161** to form the digital trimming timing signal $P_T$.

In the digital trimming timing decision circuit 160, the delay circuit 165 provides a time difference so as to set the correction data $(CBA)_2$ after the 3-bit down counter 163 has been set. In other words, when $S_f$ changes to the "L" state, the reset signal ceases to be applied to the 3-bit down counter 163. The delay circuit 165 continues to supply the "H" state to the data correction setting circuit 164 long enough to transfer the $(CBA)_2$ signal to set the 3-bit down counter 163.

The digital trimming start control circuit 170 has a latch 172 and a NOR gate 174. The latch 172 transfers the digital trimming timing signal $P_T$, which is fluctuating, to the invert output XM when the clock input CL becomes "H". The invert output XM is maintained while the level of the clock input CL is in the "L" state. The NOR gate 174 receives the digital trimming timing signal $P_T$ and the invert output XM. The output of NOR gate 174 generates the digital trimming execution control signal Sc which sets the ½-frequency divider 120.

The correction data supplying means 150 may be comprised of means for converting the correction data supplied by an external operation member (not shown) and a signal input unit (not shown) which generates the data in the form of binary notation $(CBA)_2$. A switch group (not shown) forms the binary-notation $(CBA)_2$ logic, and a network of wire connection/disconnection directs the binary numbers to the appropriate outputs.

Figure 2:
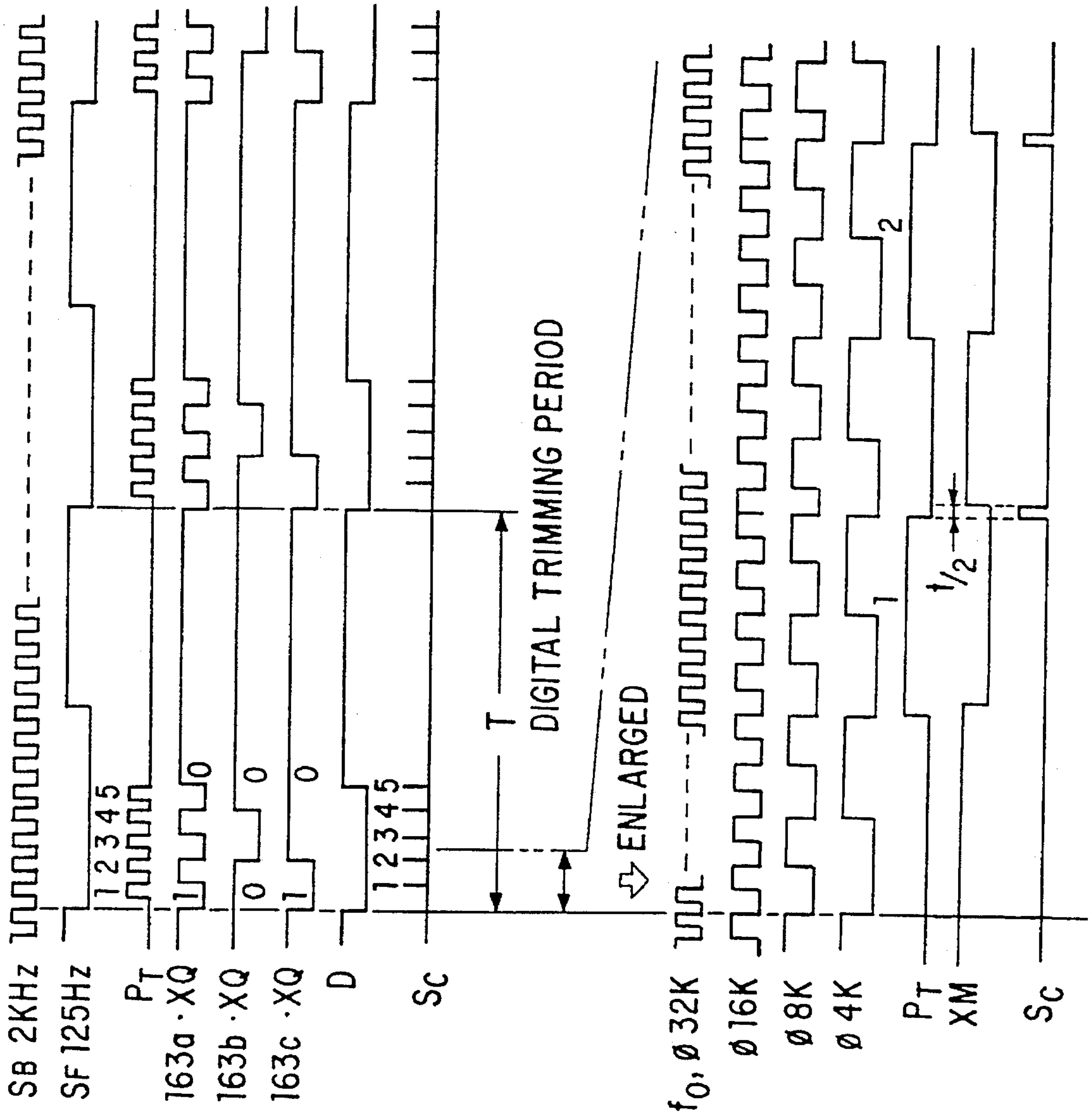
FIG. 2 is a timing chart for explaining an operation of the digital trimming circuit according to the first preferred embodiment.

In FIG. 2, a timing chart illustrates the operation of the first preferred embodiment. The time period "T" of the digital trimming period signal $S_F$ is a relatively long time period which may last from several seconds to several hundreds of seconds. Both of the digital trimming period signal $S_F$ and the timing reference signal $S_B$ are obtained by frequency-dividing the 4 KHz output of the ½-frequency divider 134.

As an example, the digital trimming period signal $S_F$ is set to 125 Hz, and the timing reference signal $S_B$ is set to 2 KHz. Also, the correction data $(CBA)_2$ is selected, for example, to be $(101)_2$. When the signal level of the digital trimming period signal $S_F$ changes from the "H" state to the "L" state, all of the following signal levels are in the "L" state: the 32 KHz-signal, the 16 KHz-signal, the 8 KHz-signal, the 4 KHz-signal, and the timing reference signal $S_B$. As soon as the digital trimming period signal $S_F$ changes to the "L" state, the reset signal ceases to be applied to the 3-bit down counter 163.

After the reset signal is removed, the delay circuit 165 continues to supply the "H" state to the data correction setting circuit 164 long enough to transfer the $(101)_2$ signal to set the 3-bit down counter 163. At this point, the following signals change: the invert output XQ of the ½-frequency divider 163*a* becomes an "L" level; the invert output XQ of the ½-frequency divider 163*b* becomes an "H" level; and the invert output xQ of the ½-frequency divider 163*c* becomes an "L" level under initial conditions. The digital trimming cancel circuit, i.e. the AND gate 166, changes state so that the detection output signal D is in the "L" state. The gate opening/closing control signal "G" is changed from an "L" state into an "H" state by the inverter 167, therefore the AND gate 161 functions as an open gate. As a consequence, the timing reference signal $S_B$ passes through the AND gate 161 to become the digital trimming timing signal $P_T$. Then, this timing signal $P_T$ is supplied to the down counter 163 as a clock input and to the digital trimming start control circuit 170 as an input signal.

Every time the pulses of the digital trimming signal $P_T$ are entered into the 3-bit down counter 163, the count down operation of this down counter is performed. Therefore, the output of the 3-bit down counter $(XQ_{163c}, xQ_{163b}, XQ_{163a})_2$ are changed as follows: $(101)_2$, $(100)_2$, $(011)_2$, $(010)_2$, $(001)_2$, and $(000)_2$. When the fifth timing pulse is supplied to the down counter 163, the count value becomes $(000)_2$ and the invert output XM of the 3-bit down counter becomes $(111)_2$. Since all three of the invert output xQ of the ½-frequency divider 163*a*, 163*b*, and 163*c*, are in the "H" state, the signal level of the detection output "D" of the AND gate 166 functioning as the digital trimming cancel circuit is changed from an "L" level into an "H" level. This causes the signal level of the gate opening/closing control signal "G" to change from an "H" level into an "L" level due to the inverter 167. Therefore, the AND gate 161 is closed and the timing reference signal $S_B$ is blocked. The digital trimming timing signal $P_T$ remains in the "L" state.

When the timing reference signal $S_B$ was passing through the AND gate 161, five pulses of the digital trimming timing signal $P_T$ are output during a time duration from a gate opening point of the AND gate 161 to a gate closing point thereof.

The following scenario occurs in the digital trimming start control circuit 170. Before the signal level of the digital trimming timing signal $P_T$ changes from an "H" level into an "L" level, the 32 KHz basic oscillation clock $f_0$ that functions as the clock input CL is also in the "H" state. The signal level of the invert output XM of the latch 172 changes to the "L" state. Then, the signal level of the basic oscillation clock $f_0$ changes to the "L" state so that the invert output XM is maintained. During this time period t/2 (½ time period), the signal level (state) of the digital trimming timing signal $P_T$ is changed from the "H" level into the level. Therefore, the digital trimming execution control signal $S_c$ produced by the AND gate 174 has an "H" level during the t/2-time period. The digital trimming execution control signal $S_c$ is applied to the set input of the ½-frequency divider 120 with data set function (thus, the ½-frequency divider 120 functions as a digital trimming amount applying means). Since the ½-frequency divider 120 is set to "1" at a time instant when the signal level of this output Q (16 KHz signal) is changed from the "H" level into the "L" level, this output Q (16 KHz signal) is shortened only by one time period (about 30 microseconds) of the basic oscillation clock $f_0$. Similarly, as the basic oscillation clock $f_0$ is shortened by one time period (30 microseconds) in response to each of the second, third, fourth and fifth digital trimming execution control signals $S_c$, the basic oscillation clock $f_0$ is shortened by 5×30=150 microseconds. Therefore, the five digital trimming initiations are performed within one digital trimming time period. As a result, the time reference $S_T$ is obtained by frequency-dividing this basic oscillation clock $f_0$ that is shortened by 150 microseconds within one digital trimming time period T. This amount of digital trimming time is not given within one digital trimming initiation, but a plurality of digital trimming initiations are discretely or distributely allocated within one digital trimming time period.

In this first preferred embodiment, five sets of the digital trimming initiations, in total, are carried out for a time interval of the timing reference signal $S_B$ within one digital trimming period in accordance with the correction data $(101)_2$. Therefore, the digital trimming amount for one digital trimming initiation may be selected to be ⅕ of the total digital trimming amount, i.e., 150 microseconds. Furthermore, it is possible to neglect such an adverse influence caused by one digital trimming correction, which will be given to a system such as a clock. For instance, in such a conventional system in which a motor driving pulse having a pulse width of 3.9 milliseconds is continuously output at a rate of 128 pulses per digital trimming second, when a 5-bit digital trimming operation is performed, the pulse width of the motor driving pulse, or the pulse interval thereof, is varied by 0.98 milliseconds maximum in a conventional system. This variation corresponds to 25% of the pulse width, or the pulse interval, and is not allowable, due to the requirements necessitated for a stable motor drive. If the timing reference signal $S_B$ is selected to be 30 microseconds, a resultant degree of this adverse influence becomes 0.78%. Therefore, the shortening/expanding amount of the pulse width, or the pulse interval, is negligible. As a consequence, the digital trimming timings in the system are not a concern, and therefore a degree of freedom in the setting operation is improved.

Although the digital trimming timing decision circuit 160 is constructed of ½-frequency dividers, this decision circuit may be an arrangement of shift registers. Also, as will be discussed later, the digital trimming timing decision circuit 160 may include a microcomputer (CPU) together with the digital trimming period forming circuit 140.

Furthermore, the digital trimming start control circuit 170 in the above-described first preferred embodiment is provided by the latch 172 and the NOR gate 174. However, this control circuit 170 is not limited thereto, but may be constructed of a delay means for slightly delaying the phase of the digital trimming timing signal $P_T$ with respect to the phase of the basic oscillation clock $f_0$ having the frequency of 32 KHz. The control circuit 170 could also have an exclusive OR gate for producing the digital trimming execution control signal $S_c$ from the delayed digital trimming timing signal and the basic oscillation clock $f_0$.

Furthermore, in this first preferred embodiment, the digital trimming operation with the minimum digital trimming amount (time period "t" of basic oscillation clock=30 microseconds) is performed by way of a one stage ½-frequency divider 120. Alternatively, the number of stages of the ½-frequency divider may be increased within a range where no adverse influence is given to the system, whereby one digital trimming amount may be increased. In addition, the digital trimming operation of this preferred embodiment is carried out along the direction of time reduction in order to correct time delays. Alternatively, when the variation of the digital trimming timing signal $P_T$ is synchronized with the falling edge ("H" level to "L" level) of the 16 KHz signal and also the ½-frequency divider 120 is reset by the digital trimming execution control signal $S_c$, such a digital trimming operation may be carried out along the direction of time expansion, so that a time lead may be corrected. In this case, it is required that the frequency divider 132 is simultaneously reset in response to the digital trimming execution control signal $S_c$ in order that the negative effect of the variation ("H" level to "L" level) of the 16 KHz signal by resetting the ½-frequency divider 120 is not passed to the subsequent ½-frequency divider.

Although 32 KHz is used as the oscillation frequency of the basic oscillation clock in this first preferred embodiment, the present invention is not limited to this oscillation frequency. Any other oscillating circuits capable of oscillating frequencies higher than, or lower than, 32 KHz may be employed so as to oscillate the basic oscillation clock.

Figure 3:
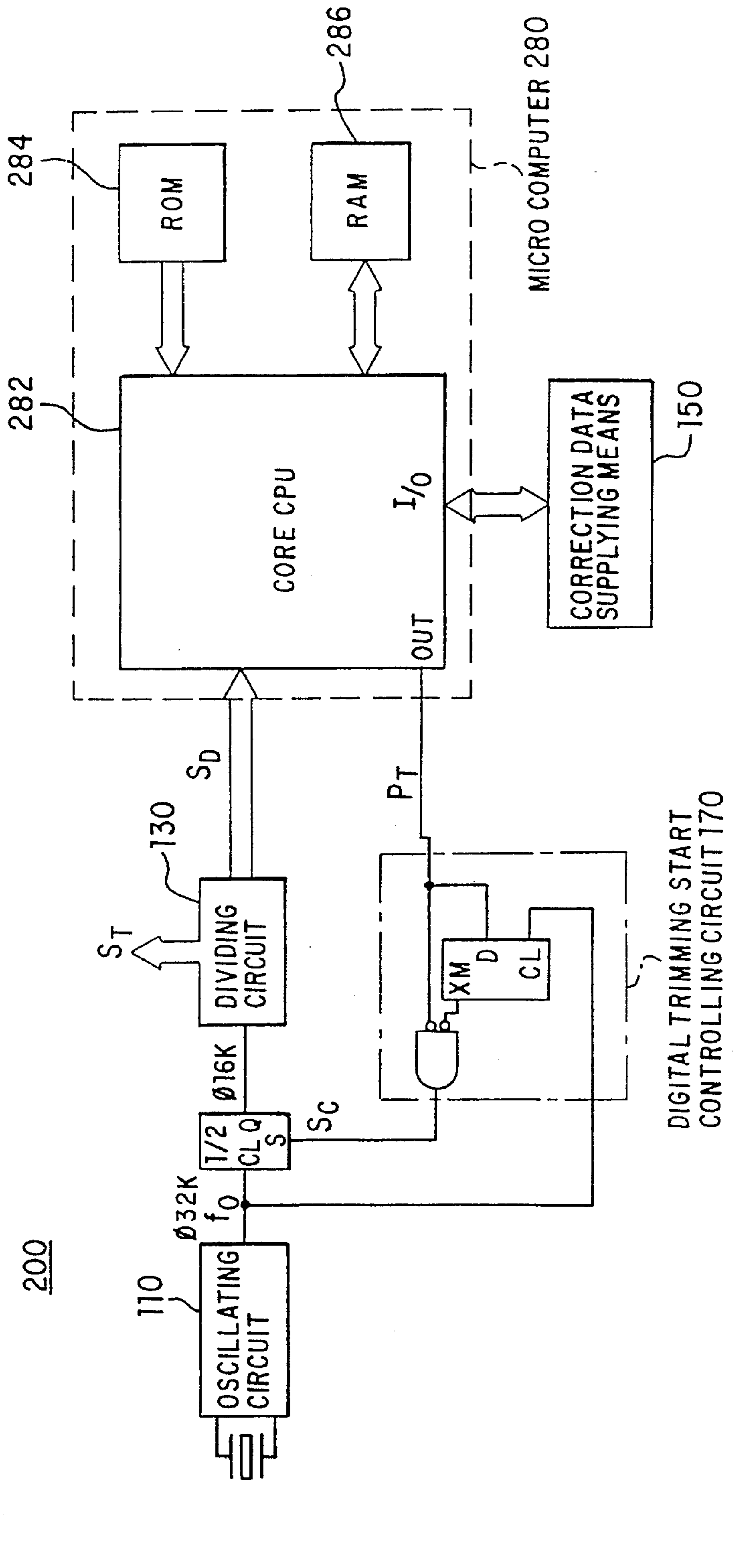
FIG. 3 is a schematic block diagram representing an arrangement of a digital trimming circuit according to a second preferred embodiment of the present invention.

A second preferred embodiment of the present invention will be described with reference to FIG. 3. The digital trimming timing decision circuit 160 and digital trimming period forming circuit 140 of the first preferred embodiment are replaced by a microcomputer. In FIG. 3, a schematic block diagram shows a logic digital trimming circuit 200 employing a microcomputer. The same reference numerals shown in FIG. 1 will be employed for denoting the same circuit portions in the following drawings, and explanations thereof are omitted.

A microcomputer 280 is constructed of a core CPU 282, a ROM (read-only memory) 284 used to hold a program memory, and a RAM (random access memory) 286 that functions as a counter. A frequency dividing circuit 130 supplies a timing reference signal $S_B$ to the core CPU 282. Several signals are produced within microcomputer 280, including a digital trimming period signal $S_F$, which has a time period N-times higher than the timing reference signal $S_B$ ("N" being an integer.) A correction data supplying means 150 supplies to the microcomputer 280 correction data in the form of serial or parallel data. The microcomputer 280 produces the digital trimming timing signal $P_T$ which is supplied to the digital trimming start control circuit 170.

Figure 4:
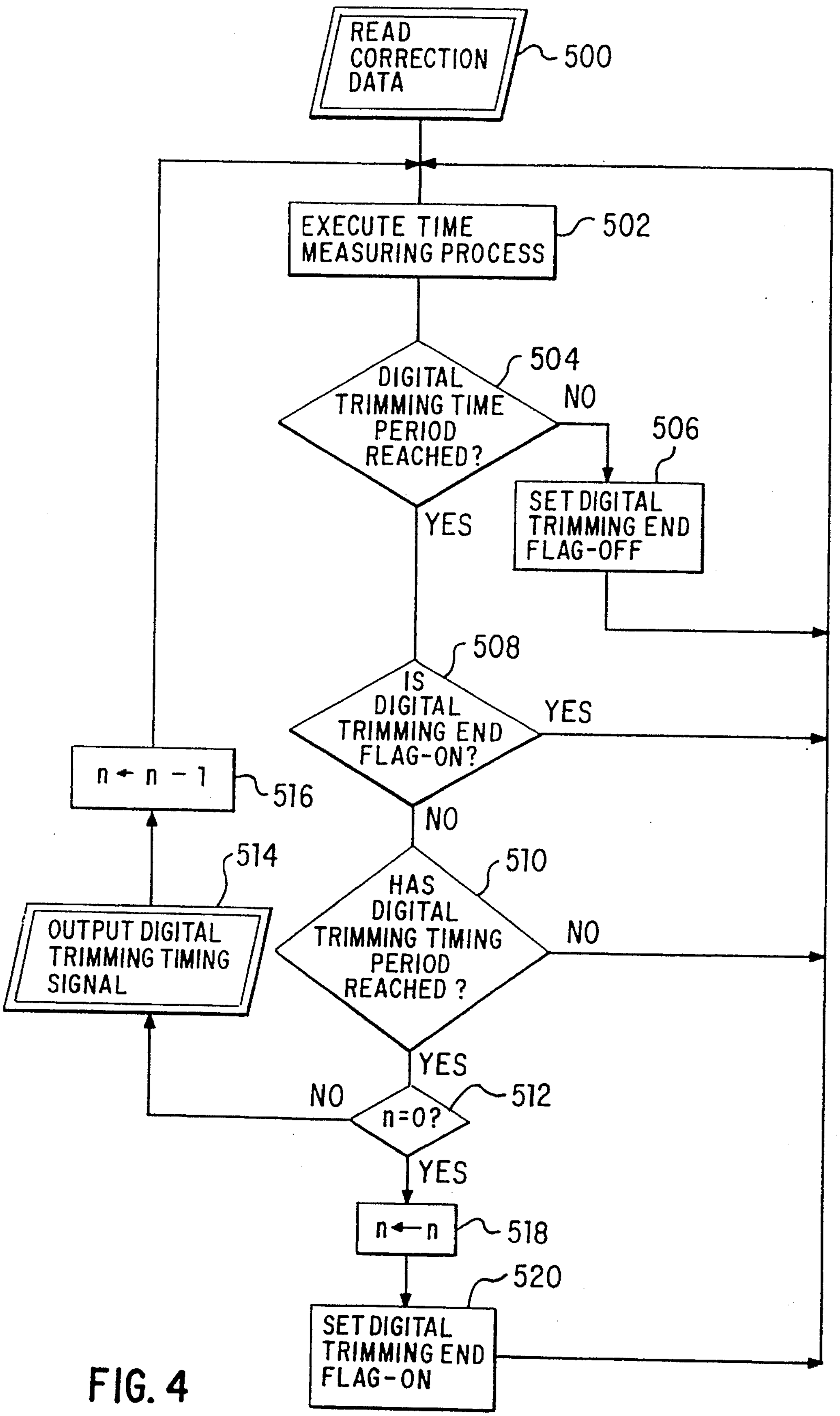
FIG. 4 is a flow chart for explaining an operation of a microcomputer employed in the second preferred embodiment.

FIG. 4 is a flow chart representing an operation of the microcomputer according to this second preferred embodiment. At step 500, the core CPU 282 reads the correction data supplied from the correction data supplying means 150. The core CPU 282 also stores a digital trimming initiation number "n" to be executed within one digital trimming time period into a digital trimming initiation number counter. The program advances to step 502 where a time measuring process is carried out. The time measuring process performs two processes. The first process produces the time reference signal $S_T$ by counting up the digital trimming time period. The second process counts up the timing reference signal $S_B$.

At step 504, a decision is made to determine whether the digital trimming time period has been reached. If the digital trimming time period has not yet been reached, then the program advances to step 506 and a digital trimming end flag is set to OFF. After the flag is set, then the process operation is returned to step 502 to continue the time measuring process. If the digital trimming time period has been reached, then another check is made to verify if the digital trimming end flag is turned ON at step 508. If the digital trimming end flag is set to ON, then the process operation is returned to step 502 to continue the time measuring process. If the digital trimming end flag is in the OFF state, then a determination as to whether a digital trimming timing period has been reached is made in step 510.

If in step 510 a determination is made that the digital trimming timing period has not yet been reached, the process operation is returned to the step 502. If in step 510 the determination is made that the digital trimming timing period has been reached, then the program advances to step 512. If the digital trimming initiation number "n" is not equal to zero, then one digital trimming timing signal $P_T$ is output to the digital trimming start control circuit 170 at step 514. As a consequence, the digital trimming correction is carried out.

After the process operation defined at step 514 has been executed, a new digital trimming initiation number is set by subtracting 1 from the digital trimming time "n" in step 516. The process operation is returned to step 502. After "n" pieces of digital trimming timing signals $P_T$ are produced in accordance with such a process flow, the content of the digital trimming initiation counter becomes zero. Therefore, in step 512 the determination that n=0 is made and the process operation advances to step 518. The content of the digital trimming initiation number counter is set to "n" at step 518 in order to return the number of the digital trimming initiation operation, which should be executed within the next digital trimming period, to the initial value. At step 520, the digital trimming end flag is set to ON. Thereafter, the process operation is returned to step 502.

As described above, the timing controls of the software control in the microcomputer replace both the digital trimming timing decision circuit 160 and the digital trimming period forming circuit 140 in the first preferred embodiment.

Figure 5:
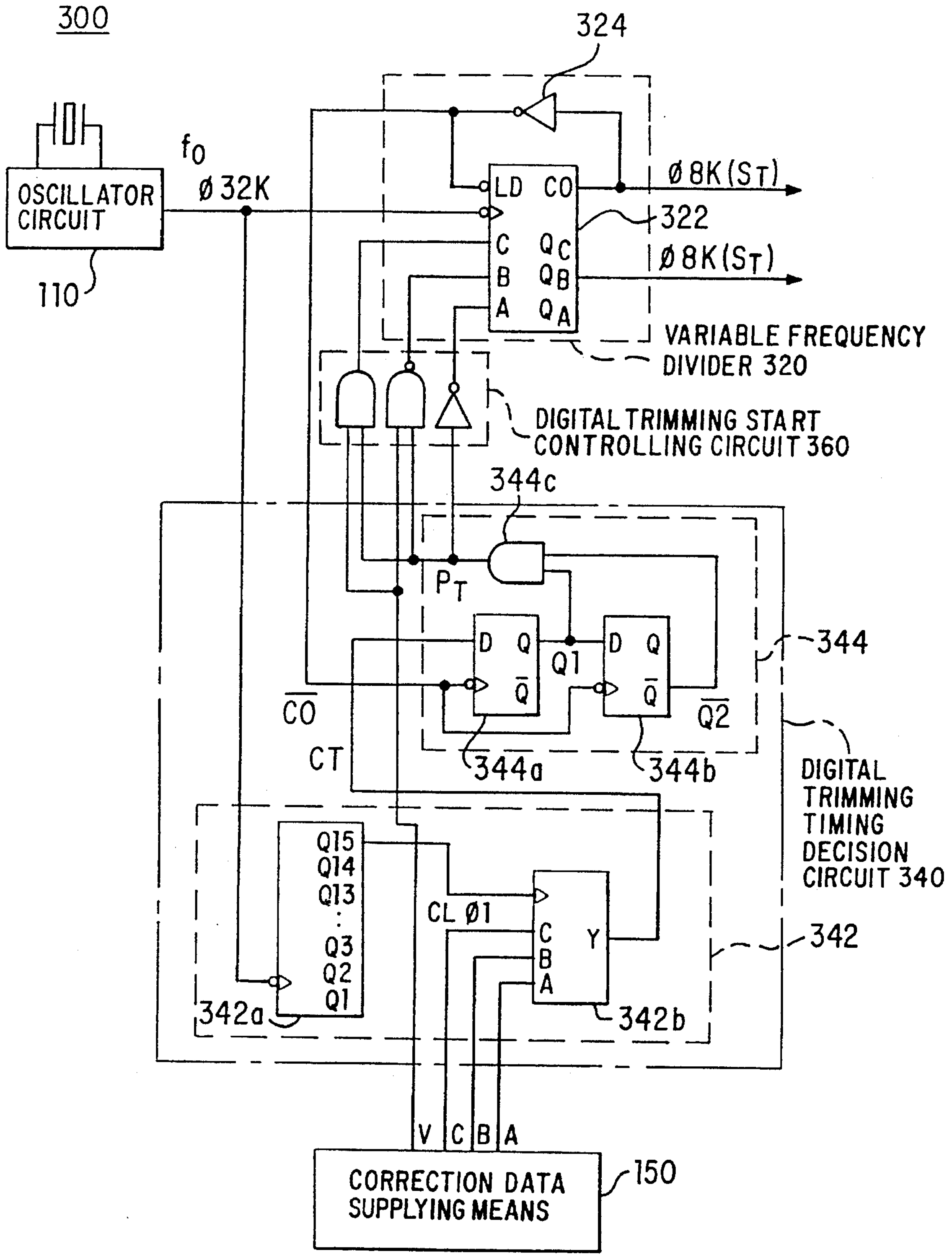
FIG. 5 is a schematic block diagram indicating an arrangement of a digital trimming circuit according to a third preferred embodiment of the present invention.

A third preferred embodiment of the present invention is shown in FIG. 5. A digital trimming circuit 300 according to this preferred embodiment includes an oscillator circuit 110 oscillating at a frequency of 32 KHz as a basic oscillation frequency. A variable frequency divider 320, which functions as a digital trimming amount applying means, generates a time reference signal $S_T$ based on the basic oscillation clock $f_0$. A digital trimming timing decision circuit 340 generates a digital trimming timing (pulse) signal $P_T$. The correction data supplying means 150 supplies digital trimming amount data $(CBA)_2$ to the digital trimming timing decision circuit 340. The number of pulses in the digital trimming timing signal $P_T$ corresponds to digital trimming amount data $(CBA)_2$ within one digital trimming time period and the basic oscillation clock $f_0$. A digital trimming start control circuit 360 designates a frequency division ratio of the frequency divider 320 based upon delay-speed designation data $(V)_2$ (also supplied by correction data supplying means 150) and a digital trimming timing signal $P_T$.

The variable frequency divider 320 has a down counter 322 with a data set function and an inverter 324. The down counter 322 has the following connections: a clock input for the basic oscillation clock $f_0$; 3-bit data set inputs A, B, C; 3-bit count outputs $Q_A$, $Q_B$, $_C$; a zero signal output $\overline{CO}$ for outputting a signal with an "H" level when a count value is zero; and a load input into which an invert signal $\overline{CO}$ of zero signal output CO is input via the inverter 324. From this zero signal output CO of the variable frequency divider 320, a time reference signal $S_T$ is derived. Normally, the variable frequency divider 320 functions as a ¼-frequency divider, and operates in such a manner that any one of ⅓ frequency division and ⅕ frequency division is inserted during the ¼ frequency dividing operation in response to the value of the delay-speed designation data at the digital trimming timings, as will be discussed later.

The digital trimming timing decision circuit 340 has a pulse generation allocating circuit 342 and a synchronous differentiate circuit 344. The pulse generation allocating circuit 342 allocates the digital trimming timing pulses CT at substantially equal intervals within one digital trimming time period. The number of timing pulses corresponds to the digital trimming amount data $(CBA)_2$. The synchronous differentiate circuit 344 generates one digital trimming timing signal $P_T$ upon detection of the rising edge of the digital trimming timing pulse.

The pulse generation allocating circuit 342 has a frequency divider **342*a* and a binary rate multiplier (BRM) 342*b*. The frequency divider 342*a* divides the 32 KHz basic oscillation clock $f_0$ by $\frac{1}{2}^{15}$ to produce a 1 Hz-pulse allocation reference clock $CL\phi_1$. The binary rate multiplier (BRM) 342*b*** generates an output pulse CT, the number of which is set by the digital trimming amount data $(CBA)_2$, within one digital trimming time period "T" (namely, a period of 8 reference clocks $CL\phi_1$ in this third preferred embodiment).

The synchronous differentiating circuit 344 has a first-stage D flip-flop **344*a*, a second-stage D flip-flop 344*b* and an AND gate 344*c*. The first-stage D flip-flop 344*a* uses as a clock input the invert signal $\overline{CO}$ of the zero output signal from the variable frequency divider 320. The digital trimming timing pulse CT is used as a data input D. The second-stage D flip-flop 344*b* uses a Q output of the first-stage D flip-flop 344*a* as a data input D, and the invert signal $\overline{CO}$ as a clock input. The AND gate 344*c* uses a $\overline{Q}$ output of the second-stage D flip-flop 344*b* and the Q output of the first-stage D flip-flop 344*a*** to produce the digital trimming timing signal $P_T$.

Figure 6:
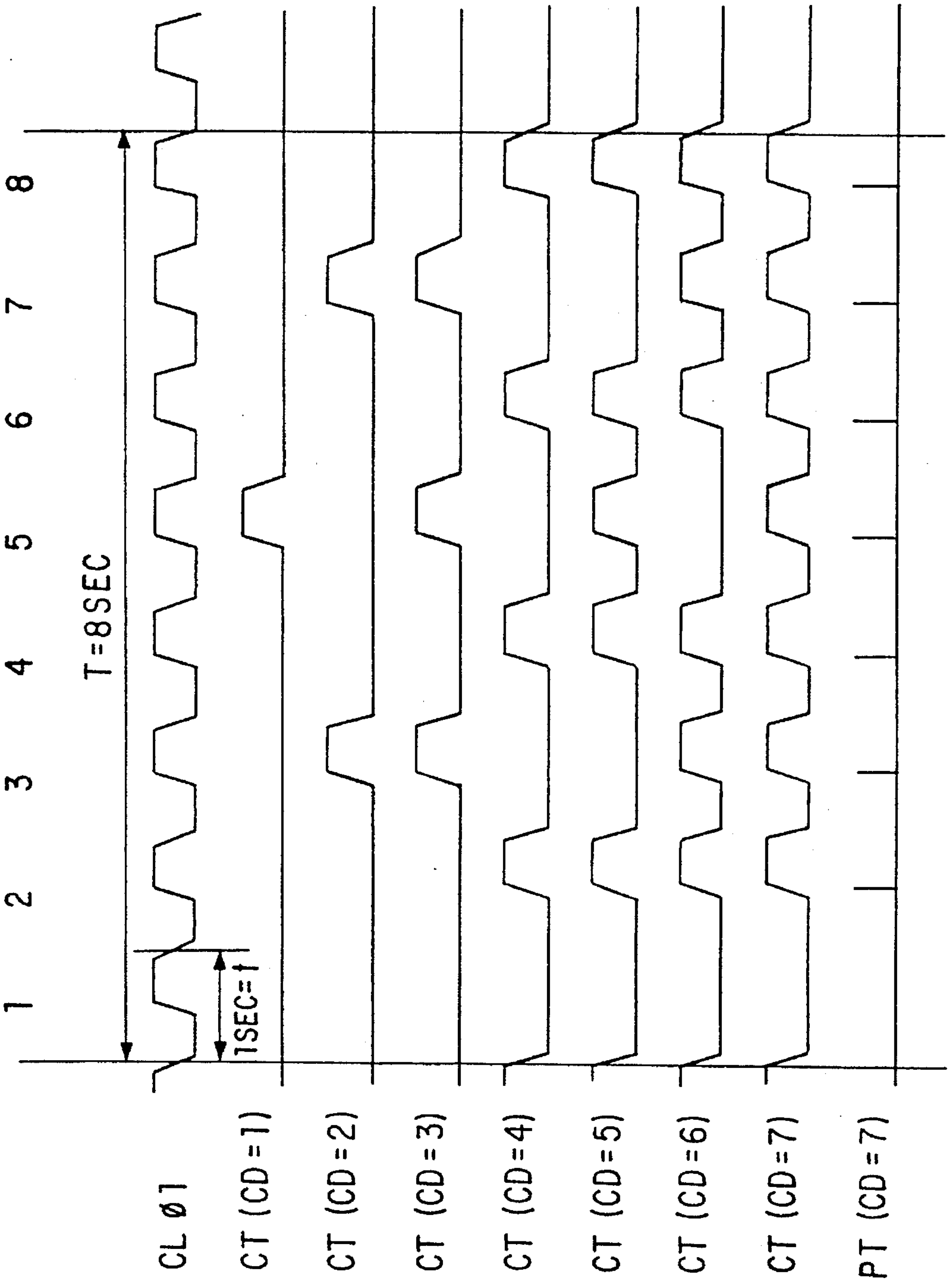
FIG. 6 is a timing chart for explaining an operation of a binary rate multiplier in the third preferred embodiment.

Referring now to timing charts shown in FIGS. 6 to 9, operations of the above-described third preferred embodiment will be explained. Referring to FIG. 6, the frequency divider **342*a* frequency-divides the basic oscillation clock $f_0$ by $\frac{1}{2}^{15}$ to produce a pulse allocation reference clock $CL\phi_1$. This reference clock is supplied to the binary rate multiplier (BRM) 342*b*. The time period during which 8 reference clocks $CL\phi_1$ are generated of corresponds to one digital trimming time period T=8t. The rate multiplier (BRM) 342*b*** outputs the digital trimming timing pulse CT, the number of pulses of which corresponds to the number of the digital trimming amount data $CD=(CBA)_2$ with respect to the 8 reference clocks.

There are seven different digital trimming timing pulse CT sequences produced. When the digital trimming amount data CD is equal to 1, so that $(CBA)_2=(001)_2$, only the 5th reference clock $CL\phi_1$ is derived. In the case when the digital trimming amount data CD is equal to 2, so that $(CBA)_2=(010)_2$, only the 3rd and the 7th reference clocks $CL\phi_1$ are derived. When the digital trimming amount data CD is equal to 3, so that $(CBA)_2=(011)_2$, only the 3rd, the 5th, and the 7th reference clocks $CL\phi_1$ are derived. When the digital trimming amount data CD is equal to 4, so that $(CBA)_2=(100)_2$, the 2nd, the 4th, the 6th and the 8th reference clocks $CL\phi_1$ are derived. When the digital trimming amount data CD is equal to 5, so that $(CBA)_2=(101)_2$, the 2nd, the 4th, the 5th, the 6th and the 8th reference clocks $CL\phi_1$ are derived. When the digital trimming amount data CD is equal to 6, so that $(CBA)_2=(110)_2$, the 2nd, the 3rd, the 4th, the 6th, the 7th and the 8th reference clocks $CL\phi_1$ are derived. When the digital trimming amount data CD is equal to 7, so that $(CBA)_2=(111)_2$, the 2nd, the 3rd, the 4th, the 5th, the 6th, the 7th and the 8th reference clocks $CL\phi_1$ are derived. The rate multiplier **342*b*** produces a predetermined number of pulses within one digital trimming time period T, and has a function to divide the one digital trimming time period T, whereby pulses are allocated at substantially equal intervals.

Figure 7:
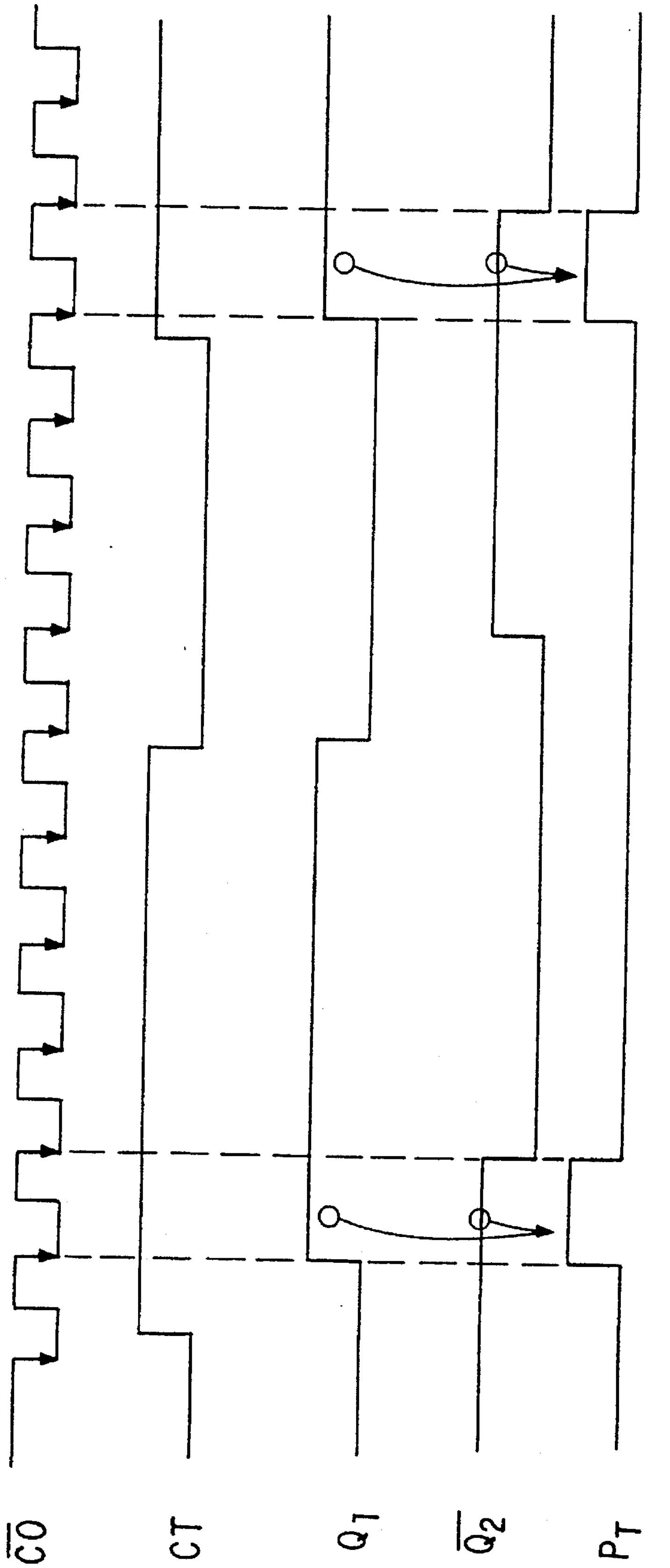
FIG. 7 is a timing chart for explaining an operation of a synchronous differentiating circuit employed in the third preferred embodiment.

To the clock inputs of the D flip-flops **344*a* and 344*b* of the synchronous differentiate circuit 344, the invert signal $\overline{CO}$ of the zero signal CO from the variable frequency divider 320 is applied. As will be discussed, normally, this invert signal $\overline{CO}$ corresponds to a 1¼-frequency division signal. When the output pulse CT of the rate multiplier 342*b* is produced, the D flip-flop 344*a* stores a value of the output pulse CT just before the invert signal $\overline{CO}$ falls to an "L" state. The D flip-flop 344*a* generates a waveform $Q_1$ as shown in FIG. 7. Also, the D flip-flop 344*b* stores a value of the waveform $Q_1$ just before the invert signal $\overline{CO}$ falls to the "L" state. The D flip-flop 344*b* generates a waveform $\overline{Q_2}$ from the $\overline{Q}$ output, as shown in FIG. 7. Since the falling edge of the waveform $\overline{Q_2}$ contains one clock delay of the invert signal $\overline{CO}$ with respect to the rising edge of the waveform $Q_1$, the pulse width of the digital trimming timing signal "$P_T$" output from the AND gate 344*c* corresponds to one clock of the invert signal $\overline{CO}$. As described above, the pulse width of the pulse CT generated from the rate multiplier (BRM) 342*b* is compressed by the synchronous differentiate circuit 344**, thereby generating the digital trimming timing signal $P_T$.

Figure 8:
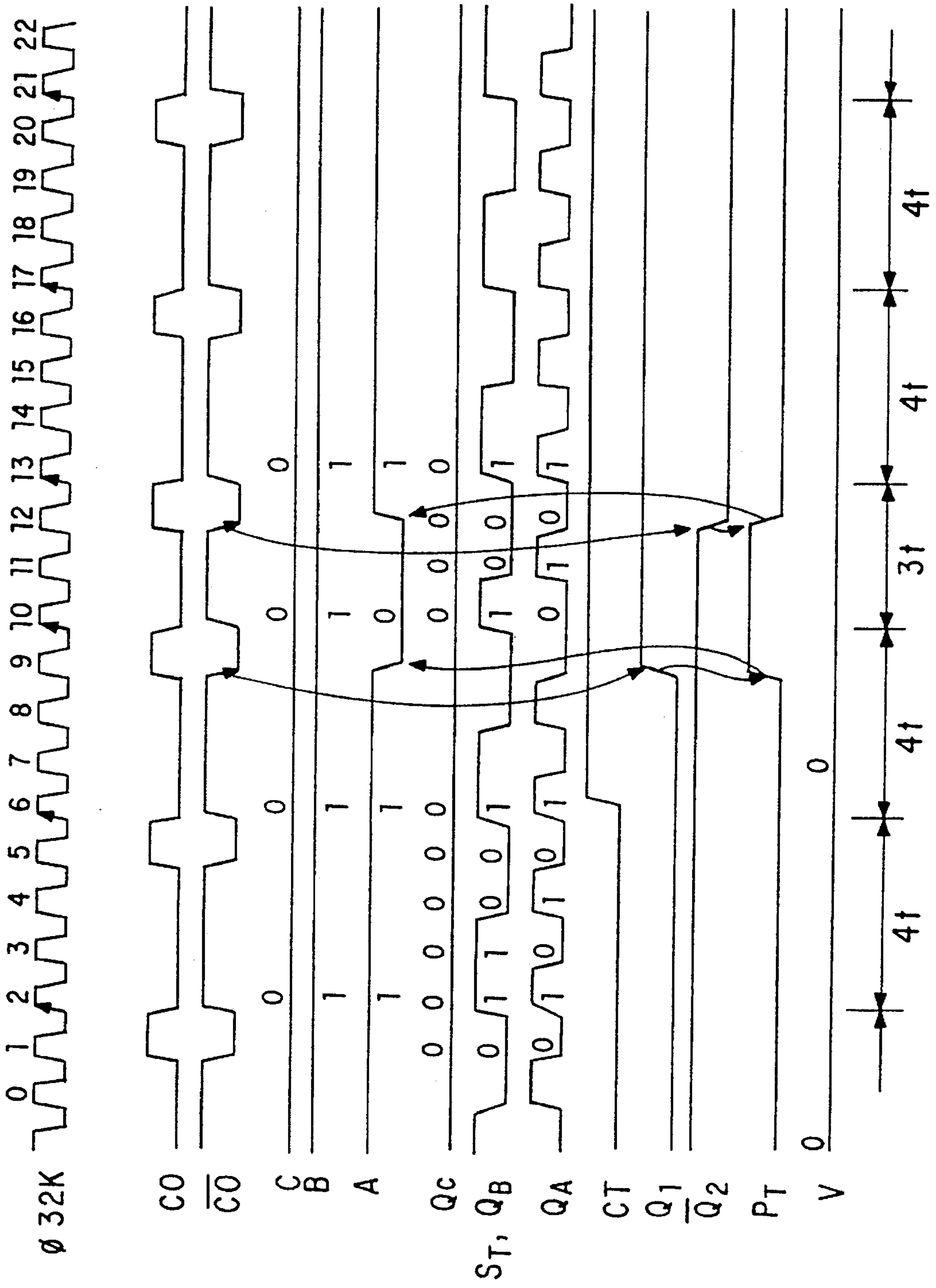
FIG. 8 is a timing chart for explaining a lead digital trimming operation in the third preferred embodiment.

As shown in FIG. 8, the delay speed data $(V)_2$ derived from the correction data supplying means 150 is equal to $(O)_2$ during such a time period. Furthermore, the level of the digital trimming timing signal $P_T$ is under the "L" state and the logic value $(CBA)_2=(011)_2$ of the digital trimming start control circuit 360 is set to the down counter 322 as an initial value at the rising timing of the invert signal $\overline{CO}$. As a consequence, every time the basic oscillation clock $f_0$ is entered, the count value $(Q_C, Q_B, Q_A)$ is shifted from $(011)_2$, and then is again set to the initial value $(011)_2$ at the next clock when the zero signal CO is produced.

The variable frequency divider 320 performs the ¼ frequency division during a time period when the delay speed data $(V)_2$ is equal to $(O)_2$ and the level of the digital trimming timing signal $P_T$ is under the "L" state. When the delay speed data $(V)_2$ remains $(O)_2$ and the level of the digital trimming timing signal $P_T$ becomes an "H" level, as indicated in FIG. 8, the logic value $(CBA)_2$ of the digital trimming start control circuit 360, which is $(010)_2$, is sent to the down counter 322 as an initial value at the rising time of the invert signal $\overline{CO}$. As a result, every time the basic oscillation clock $f_0$ is entered, the count value $(Q_C, Q_B, Q_A)_2$ is shifted from $(010)_2$ via $(001)_2$ to $(000)_2$. It is then reset to the initial value of $(010)_2$ at a clock subsequent to the occurrence of the zero signal CO. Thus, when the delay speed data $(V)_2$ is $(O)_2$ and the level of the digital trimming signal $P_T$ is in the "H" state, the variable frequency divider 320 executes the ⅓-frequency dividing operation only once.

As described above, the time reference signal $S_T$ is shortened only by one time period of the basic oscillation clock in accordance with a single ⅓-frequency dividing operation in response to a single digital trimming timing signal $P_T$. As a result, when "n" pieces of digital trimming timing (pulse) signals $P_T$ are produced within one digital trimming time period "T", the lead digital trimming operation is carried out only by "n" time periods of the basic oscillation clock $f_0$ within one digital trimming time period "T". Therefore, the third preferred embodiment can achieve an advantage similar to that of the first preferred embodiment. Moreover, according to this third preferred embodiment, since the rate multiplier **342*b*** is employed so as to produce the digital trimming timing signal $P_T$ at equal intervals allocated within one digital trimming time period, there is another merit that a plurality of digital trimming operations can be equally dispersed within one digital trimming time period. This is contrary to the first preferred embodiment where a plurality of digital trimming operations are concentrated at the beginning of the digital trimming time period. Accordingly, a degree of adverse influence given to the safety condition of the pulse motor may be mitigated.

Figure 9:
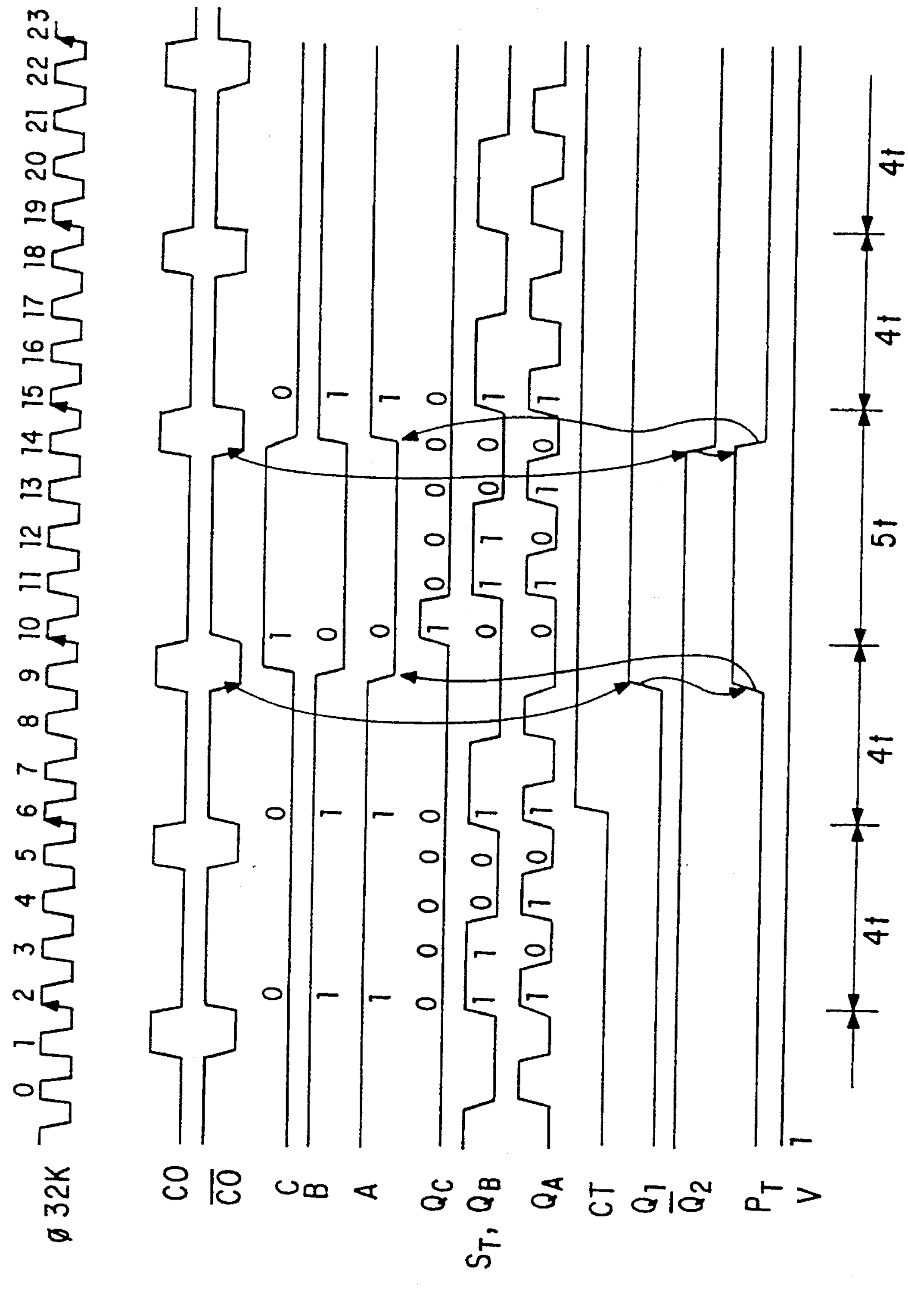
FIG. 9 is a timing chart for explaining a delay digital trimming operation in the third preferred embodiment.

Now referring to FIG. 9, the delay speed data $(V)_2$ derived from the correction data supplying means 150 is $(1)_2$. Furthermore, the level of the digital trimming timing signal $P_T$ is in the "L" state. During this time period, the logic value $(CBA)_2=(011)_2$ of the digital trimming start control circuit 360 is sent as an initial value to the down counter 322 at the rising edge of the invert signal $\overline{CO}$. As a result, every time the basic oscillation clock $f_0$ is entered, the count value $(Q_C, Q_B, Q_A)$ is shifted from $(011)_2$ via $(010)_2$ via $(001)_2$ to $(000)_2$. The count value is then set to the initial value $(011)_2$ in response to the occurrence of the zero signal CO in the subsequent clock pulse. Accordingly, during this time period that the delay speed data $(V)_2$ becomes $(O)_2$ and the level of the digital trimming timing signal $P_T$ is under the "L" state, the variable frequency divider 320 performs the ¼ frequency division irrelevant to the condition of the delay speed data $(V)_2$.

When the delay speed data $(V)_2$ is equal to $(1)_2$ and the level of the digital trimming timing signal $P_T$ changes to the "H" level, the logic value $(CBA)_2=(100)_2$ of the digital trimming start control circuit 360 is sent to the down counter 322 as the initial value at the rising edge of the invert signal $\overline{CO}$. As a consequence, every time the basic oscillation clock $f_0$ is input, the count value $(Q_C, Q_B, Q_A)$ is shifted from $(100)_2$ via $(011)_2$, $(010)_2$, $(001)_2$ to $(000)_2$. Then, this count value is again set to the initial value $(100)_2$ in response to the next clock pulse when the zero signal CO is generated. Accordingly, when the delay speed data $(V)_2$ becomes $(1)_2$, and the level of the digital trimming timing signal $P_T$ is in the "H" state, the variable frequency divider 322 performs the ⅕-frequency dividing operation only once. Thus, the time reference signal $S_T$ is expanded only by one time period of the basic oscillation clock $f_0$ in accordance with a single ⅕-frequency dividing operation by a single digital trimming timing signal $P_T$. As a result, when "n" pieces of digital trimming timing signals $P_T$ are produced within one digital trimming time period, a delay digital trimming operation is carried out by "n" time periods of the basic oscillation clock $f_0$ within one digital trimming time period "T".

In accordance with this third preferred embodiment, since the digital trimming timing signal $P_T$ has been allocated within one digital trimming time period at substantially equal intervals, a plurality of digital trimming operations can be equally dispersed within one digital trimming time period. Again, this is in contrast to the first embodiment where a plurality of digital trimming operations are concentrated at the initial stage of the digital trimming time period.

Since a duty ratio of the zero signal CO from the variable frequency divider 320 is not equal to 50%, there are some cases that this zero signal is not properly used as the clock of the time reference signal $S_T$. In such a case, the duty ratio of this zero signal CO is processed by a wave shaping circuit, or the like, to be 50%. This shaped zero signal may be used as a reference signal of the time reference signal $S_T$.

In this third preferred embodiment, it is so arranged that the digital trimming timing signal $P_T$ is produced, the number of which corresponds to the value of the digital trimming amount data "CO". Alternatively, since a detection can be done regardless of whether the digital trimming operation is under execution by monitoring the digital trimming timing signal $P_T$, a process operation such as an operation interruption for other circuit blocks may be performed.

Figure 10:
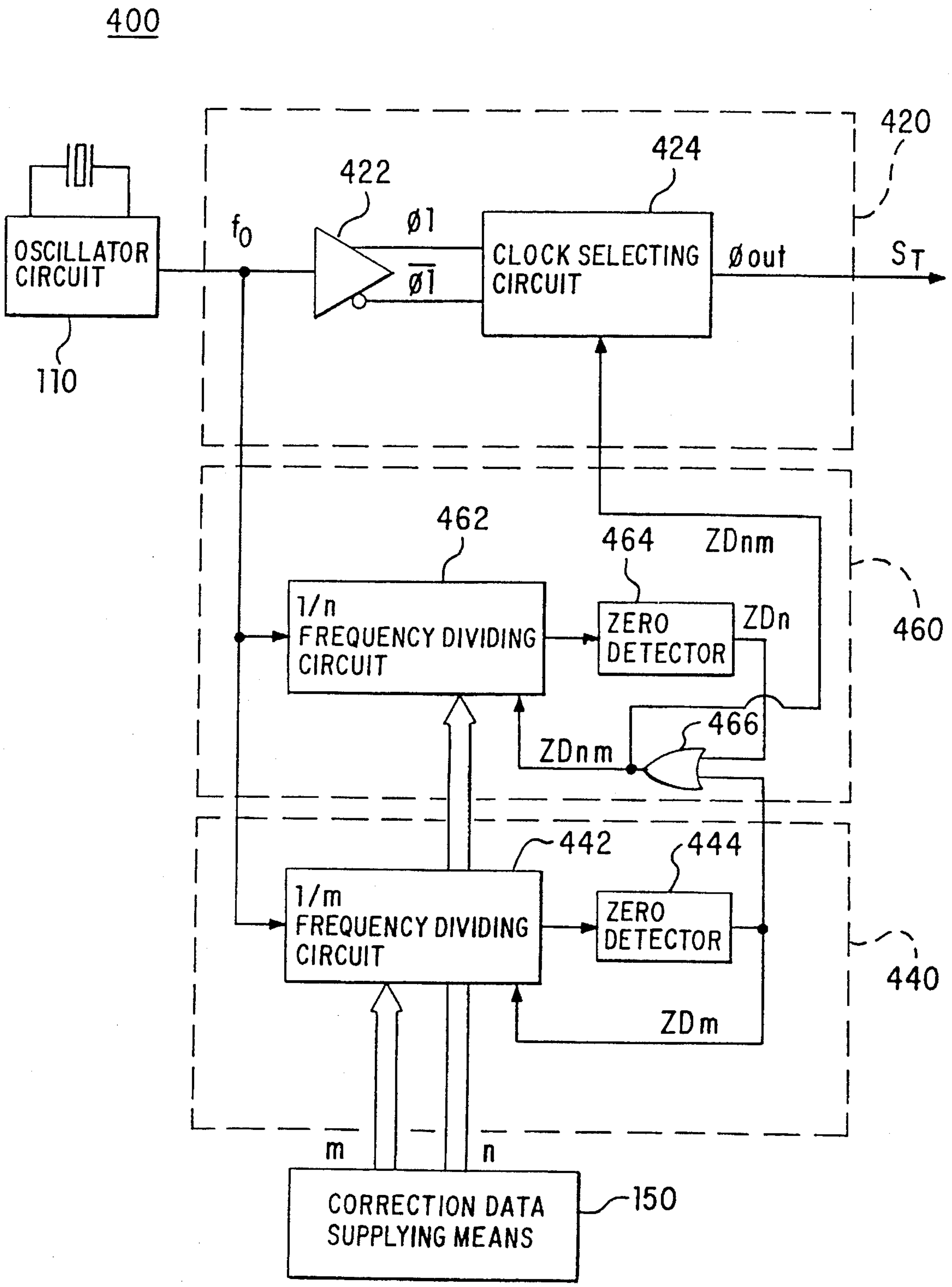
FIG. 10 is a schematic block diagram representing an arrangement of a digital trimming circuit according to a fourth preferred embodiment of the present invention.

FIG. 10 is a schematic block diagram showing a circuit arrangement of a digital trimming apparatus according to a fourth preferred embodiment of the present invention. A digital trimming circuit 400 has an oscillator circuit 110 oscillated at a basic oscillation frequency $f_0$ of 32 KHz. A correction data supplying means 150 supplies a correction data (digital trimming period designation data) "m" to a digital trimming period decision circuit 440 which produces a digital trimming period pulse ZDm based on the basic oscillation frequency $f_0$. A digital trimming timing decision circuit 460 (also called digital trimming converting device) receives the digital trimming period pulse ZDm, the basic oscillation frequency $f_0$, and a correction data (digital trimming interval designation data) "n", which is supplied by the correction data supplying means 150, to produce a digital trimming timing signal ZDnm (also called start control pulse signal). A digital trimming amount applying circuit 420 receives the basic oscillation frequency $f_0$ and the digital trimming timing signal ZDnm to generate the time reference signal $S_T$.

The digital trimming amount applying circuit 420 has a complementary output circuit 422 and a clock selecting circuit 424. The complementary output circuit 422 produces an in-phase clock φ1 and the reverse phase clock $\overline{\phi 1}$ based on the basic oscillation clock $f_0$. The clock selecting circuit 424 generates a $\phi_{out}$ by selecting the in-phase clock φ1 and the reverse phase clock $\overline{\phi 1}$ in response to the digital trimming timing signal ZDnm. The selected clock $\phi_{out}$ is the time reference signal $S_T$.

The digital trimming period decision circuit 440 has a 1/m-frequency dividing circuit 442 and a zero detector 444. The 1/m-frequency dividing circuit 442 functions as a down counter with a preset function. The initial value "m" from the correction data supplying means 150 is set in response to the digital trimming period pulse ZDm. The zero detecting circuit 444 detects when the count value of the down counter becomes zero.

The digital trimming timing decision circuit 460 has a 1/n-frequency dividing circuit 462, a zero detecting circuit 464, and an OR gate 466. The 1/n-frequency dividing circuit

462 functions as a down counter with a preset function. The initial value "n" from the correction data supplying means 150 is set in response to the digital trimming timing signal ZDnm. The zero detecting circuit 464 detects when the count value of this down counter becomes zero. The OR gate 466 produces the digital trimming timing signal ZDnm based upon the zero detection signal ZDn of the zero detecting circuit 464 and the digital trimming period pulse ZDm of the zero detecting circuit 444.

Figure 11:
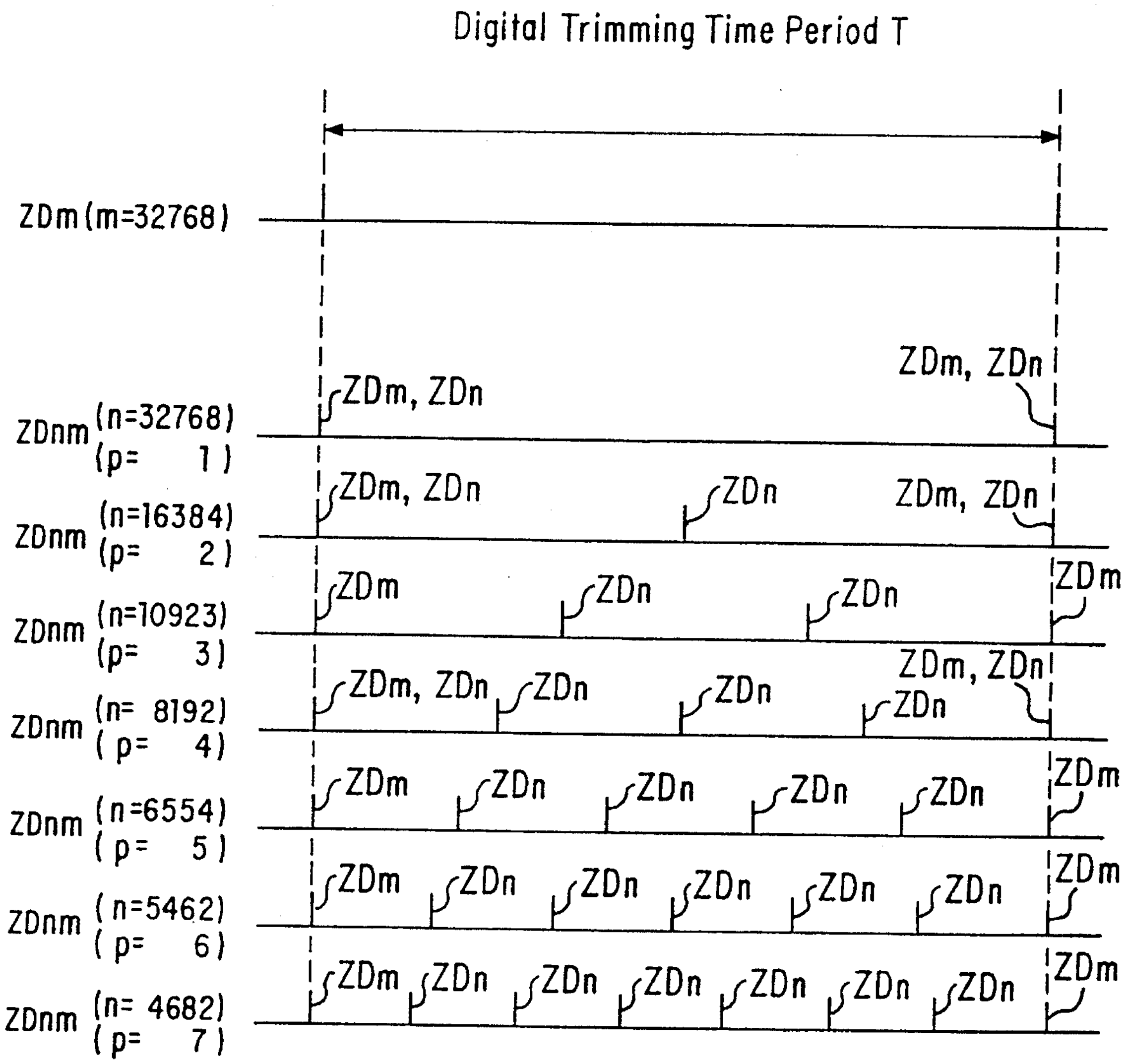
FIG. 11 is a timing chart for indicating a producing condition of the digital trimming timing signal ZDmn in the fourth preferred embodiment.

The initial value "m" is supplied from the correction data supplying means 150 to the 1/m-frequency dividing circuit 442 which executes the count down operation upon receipt of the basic oscillation clock $f_0$. When the count value becomes zero, the zero detection signal ZDm is generated from the zero detecting circuit 444, so that the initial value "m" is again set to this 1/m-frequency dividing circuit 442. As shown in FIG. 11, the zero detection signal ZDm is produced every time "m" pieces of basic oscillation clocks $f_0$ are generated, which will then form a digital trimming period pulse. On the other hand, the initial value "n" is also supplied from the correction data supplying means 150 to the 1/n-frequency dividing circuit 462 which will then execute the count down operation upon receipt of the basic oscillation clock $f_0$. When the count value of this down counter becomes zero, the zero detection signal ZDn is generated from the zero detecting circuit 464, so that the following will occur: the initial value "n" is reloaded on this 1/n-frequency dividing circuit 462, in response to the zero detection signal ZDn; and the initial value "m" is reloaded thereon in response to the digital trimming period pulse ZDm of the zero detecting circuit 444. To produce the digital trimming timing signals ZDnm at substantially equal intervals within one digital trimming time period T, the correction data "m" and "n" satisfy the following relationship:

$$(n \times P) - m = r, \quad (4)$$

where the symbol "r" indicates a minimum positive integer smaller than "n," and the symbol "p" denotes the quantity of the digital trimming timing signals ZDnm generated within one digital trimming time period T.

Assuming now that the correction data "m" is equal to $2^{15}$=32768, as indicated in FIG. 11, the digital trimming period pulse is output from the zero detecting circuit 444 when the 32768th basic oscillation clock is produced. In this case, the digital trimming operation is executed at the starting point of the digital trimming time period T. In the case when n equals 16384, since the zero detection signal ZDn is also produced when the 16384th basic oscillation clock $f_0$ is generated, p=2 and r=0. As a consequence, the digital trimming operations are executed at the starting point of the digital trimming time period T and at the T/2 time instant. When n equals 10923, the zero detection signal ZDn is produced when the 10923rd and 21846th basic oscillation clocks $f_0$ are produced. The digital trimming period pulse ZDm is produced before the 32769th basic oscillation clock $f_0$ is generated. The interval between the 21846th basic oscillation clock and the starting point of the digital trimming time period is shorter than the other pulse interval by only one basic oscillation clock. Since this shorter interval corresponds to a difference in 1% time interval, it can be asserted that the digital trimming timing signals ZDnm are allocated at substantially equal intervals. Accordingly, in this fourth preferred embodiment, a plurality of digital trimming operations can be uniformly dispersed within one digital trimming time period. Unlike the first preferred embodiment, the plural digital trimming operations are not concentrated at the beginning of the digital trimming time period. Furthermore, no digital trimming timing signals are obtained by curtailing the input pulses, which occurred in the third preferred embodiment.

The rounding effects of the digital trimming period pulse ZDm occur even under such cases when n equals 6554, 5462 and 4682 as shown in FIG. 11. The rounding effects may be negligible by setting the value of "m" to a large value.

Figure 12:
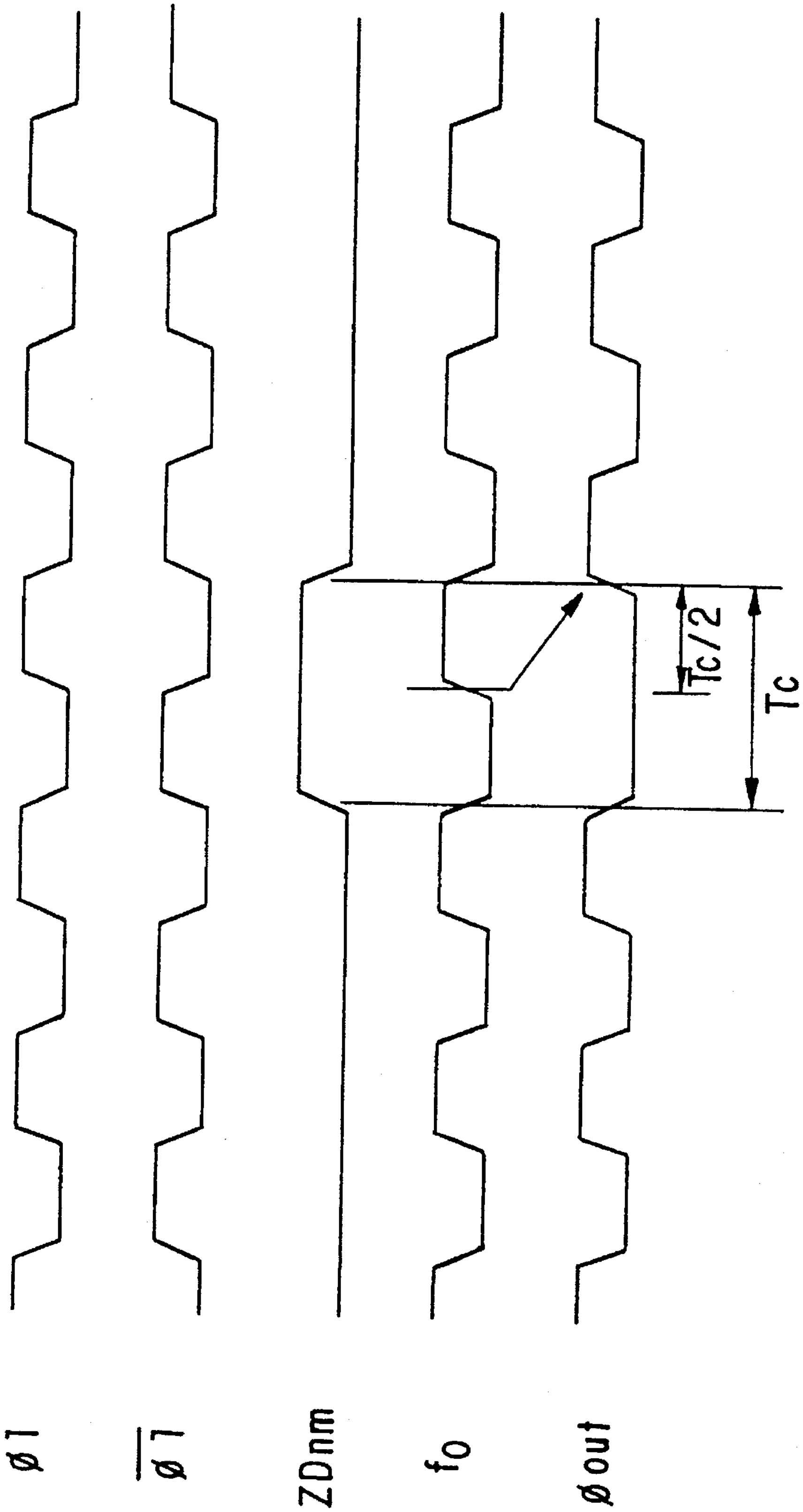
FIG. 12 is a timing chart for explaining an operation of the clock selecting circuit in the fourth preferred embodiment.
Figure 13:
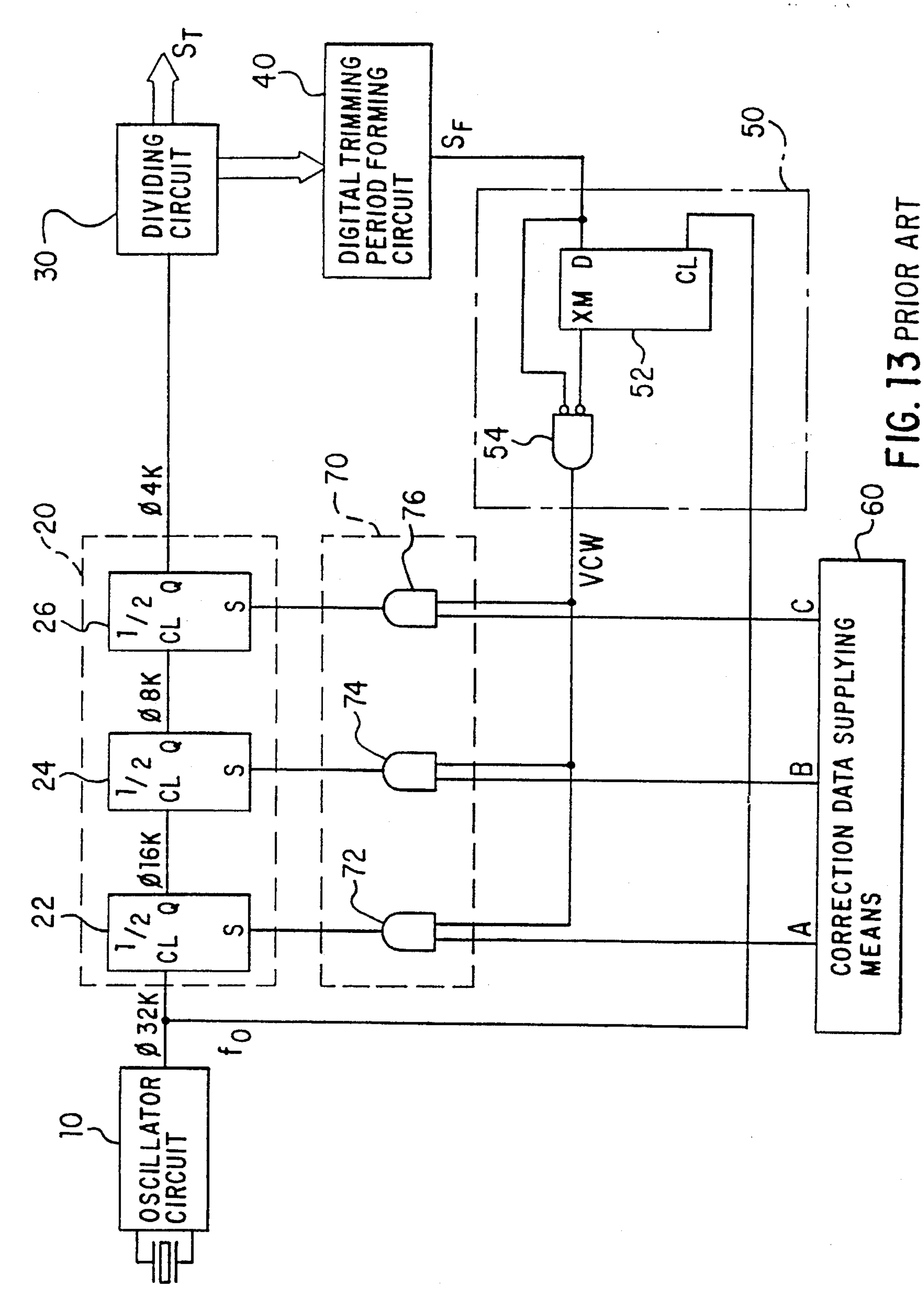
FIG. 13 PRIOR ART
FIG. 13 is a schematic block diagram showing an arrangement of the conventional digital trimming circuit.
Figure 14:
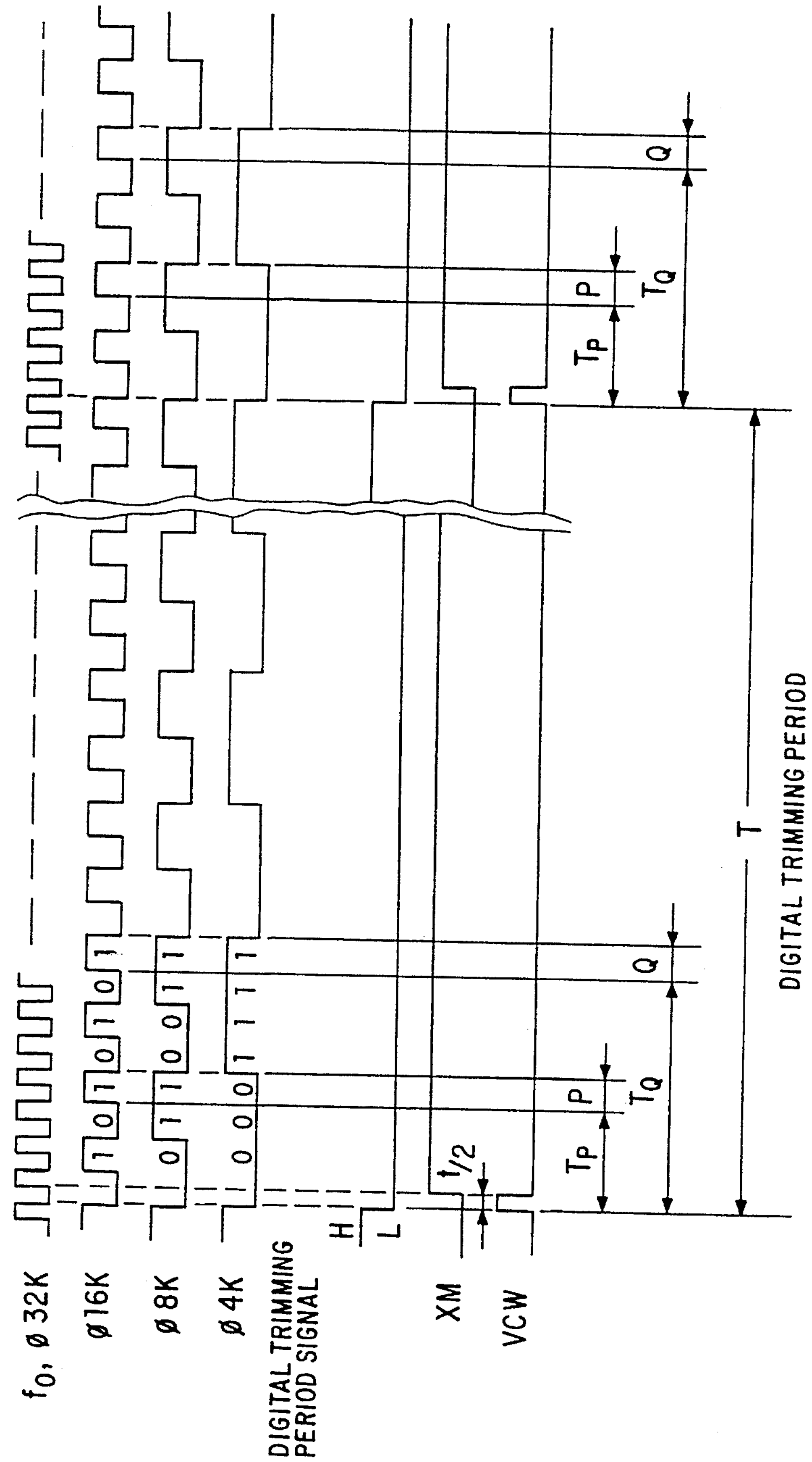
FIG. 14 PRIOR ART
FIG. 14 is a timing chart for explaining an operation of the conventional digital trimming circuit.

Referring to FIG. 12, the following is an explanation of an operation of the digital trimming amount applying circuit 420. In the clock selecting circuit 424, every time the digital trimming timing signal ZDnm is produced, the output signal $\phi_{out}$ is changed. For example, when the in-phase clock $\phi 1$ has been selected as the output signal $\phi_{out}$ and the digital trimming timing signal ZDnm is input into the clock selecting circuit 424, the clock selecting circuit 424 selects the reverse phase clock $\overline{\phi 1}$ as the output signal $\phi_{out}$. Also when the reverse clock $\overline{\phi 1}$ is input, the clock selecting circuit 424 selects the in-phase clock $\phi 1$ as the output signal $\phi_{out}$. Since the clock changing timing of the clock selecting circuit 424 corresponds to the "L" period of the output signal $\phi_{out}$, the output signal $\phi_{out}$ during this changing operation is expanded by a half period (Tc/2) of the basic oscillation clock $f_0$, as represented in FIG. 12.

In the previous preferred embodiments, the variable frequency divider was employed as the digital trimming amount supplying means and the method for changing the frequency dividing ratio based on the digital trimming timing was used. In accordance with this fourth preferred embodiment, such a method for expanding/reducing the output signal by a half of the clock time period in response to the changing operation between the in-phase clock $\phi 1$ and the reverse clock $\overline{100\ 1}$ has been utilized. As a result, since the minimum digital trimming amount does not correspond to one time period of the basic oscillation clock, but a half period thereof, the expansion/reduction ratio of the time reference signal effected by the digital trimming operation may be further suppressed.

As previously described in detail, the dispersive digital trimming method is employed in which a plurality of digital trimming operations with the short digital trimming amounts are dispersively executed within one digital trimming time period. A digital trimming amount supplying means executes the digital trimming operation with a predetermined digital trimming amount in response to the initiation control signal. Therefore, the time reference signal, which is based on the basic oscillation frequency, is produced.

Also, the digital trimming amount-to-pulse number converting means produces the initiation control pulse signal within one digital trimming time period, the number of pulses corresponds to the correction data for designating the digital trimming amount which should be executed within one digital trimming time period. Since the initiation control pulse signals are obtained within one digital trimming time period, a plurality of digital trimming operations are dispersively performed within one digital trimming time period. The digital trimming amount of the digital trimming amount applying means is coincident with such a value calculated by dividing, for instance, the digital trimming amount to be operated within one digital trimming time period by the pulse number. Then, the digital trimming amount required within one digital trimming time period is applied. Therefore, the digital trimming amount can be coincident with the logic digital trimming rate required for the time reference signal.

The expansion/reduction amount for the time reference signal at the digital trimming timing can be suppressed. In other words, since the digital trimming operation with the minimum expansion/reduction amount corresponding to the time period of the basic oscillation signal can be realized, interference caused by the digital trimming timing and a predetermined output timing may be negligible, or greatly suppressed.

The digital trimming timing equal-allocating means generates the initiation control signal. This means allocates pulses at substantially equivalent time intervals. The time intervals are calculated by dividing one digital trimming time period by the above-described pulse number. Therefore, a plurality of digital trimming timings are not concentrated into a portion of one digital trimming time period, but are dispersed therethrough. As a result, a reduction in the negative affect of the output timings is achieved.

When the complementary signal forming means generates the in-phase signal and the reverse phase signal in response to the basic oscillation signal, and also the signal selecting means for selecting the in-phase signal and the reverse phase signal to be output are employed as the digital trimming amount applying means, the digital trimming operation with the minimum digital trimming amount equal to a half time period of the original oscillation signal can be performed. The above-described benefits are achieved.

Although the invention has been described and illustrated with particularity, it is intended to be illustrative of preferred embodiments and understood that the present disclosure has been made by way of example only. Numerous changes in the combination and arrangements of the parts and features can be made by those skilled in the art without departing from the spirit and scope of the invention, as hereinafter claimed.

What is claimed is:

1. A digital trimming apparatus for generating a time reference signal from a basic oscillation frequency supplied by an oscillation circuit, comprising:

digital trimming amount-to-pulse number converting means for generating a start control pulse signal within one digital trimming time period based on the basic oscillation frequency and a correction data, the correction data designating a digital trimming amount to be executed within the one digital trimming time period, a number of pulses in the start control pulse signal corresponding to the correction data; and digital trimming amount applying means for generating the time reference signal from the basic oscillation frequency by executing a digital trimming operation by the digital trimming amount in response to the start control pulse signal, said digital trimming amount applying means comprising:

complementary signal forming means for forming an in-phase signal and a reverse phase signal based upon said basic oscillation signal; and signal selecting means for selectively outputting said in-phase signal and said reverse phase signal.

2. The digital trimming apparatus according to claim 1, wherein the digital trimming apparatus is a semiconductor integrated circuit.

3. A digital trimming apparatus comprising:

an oscillator circuit producing a basic oscillation frequency;

a correction data supplying circuit generating a first correction data and a second correction data;

a digital trimming period decision circuit generating a first zero detector signal, the digital trimming period decision circuit having a first frequency dividing circuit receiving the basic oscillation frequency and being set by the first correction data in response to the first zero detector signal supplied by a first feedback loop, and having a first zero detector generating the first zero detection signal when the first frequency dividing circuit reaches a first predetermined value;

a digital trimming timing decision circuit generating the digital trimming timing signal, the digital trimming timing decision circuit having a second frequency dividing circuit receiving the basic oscillation frequency and being set by the second correction data in response to the digital trimming timing signal supplied by a second feedback loop, having a second zero detector generating a second zero detection signal when the second frequency dividing circuit reaches a second predetermined value, and having a signal combining means for combining the first zero detector signal and the second zero detector signal to generate a digital trimming timing signal; and a digital trimming amount applying circuit having a complementary output circuit generating an in-phase clock signal and an inverted phase clock signal based on the basic oscillation frequency, and having a clock selecting circuit generating the time reference signal in response to the digital trimming timing signal.

4. The digital trimming apparatus according to claim 3, wherein the signal combining means is an OR gate having a first input receiving the first zero detector signal and a second input receiving the second zero detector signal.

5. The digital trimming apparatus according to claim 3, wherein the first frequency dividing circuit and the second frequency dividing circuit are down counters.

6. The digital trimming apparatus according to claim 5, wherein the first and second predetermined values are zero.

* * * * *